US008073149B2

(12) United States Patent
Kuze

(10) Patent No.: US 8,073,149 B2
(45) Date of Patent: Dec. 6, 2011

(54) LOUDSPEAKER DEVICE

(75) Inventor: Mitsukazu Kuze, Osaka (JP)

(73) Assignee: Panasonic Corporation, Osaka (JP)

( * ) Notice: Subject to any disclaimer, the term of this patent is extended or adjusted under 35 U.S.C. 154(b) by 982 days.

(21) Appl. No.: 11/997,267

(22) PCT Filed: Jul. 28, 2006

(86) PCT No.: PCT/JP2006/315048
§ 371 (c)(1), (2), (4) Date: Jan. 29, 2008

(87) PCT Pub. No.: WO2007/013622
PCT Pub. Date: Feb. 1, 2007

(65) Prior Publication Data

US 2010/0092004 A1 Apr. 15, 2010

(30) Foreign Application Priority Data

Jul. 29, 2005 (JP) ................................ 2005-221212

(51) Int. Cl.
*G10K 11/16* (2006.01)
*H03B 29/00* (2006.01)
*H04R 3/00* (2006.01)

(52) U.S. Cl. ............... 381/71.11; 381/71.12; 381/71.13; 381/71.5; 381/96

(58) Field of Classification Search ............... 381/71.11, 381/71.12, 71.13, 71.5, 71.6, 93, 96
See application file for complete search history.

(56) References Cited

U.S. PATENT DOCUMENTS 5,420,932 A * 5/1995 Goodman .................... 381/71.5
5,438,625 A * 8/1995 Klippel ........................... 381/96
5,475,761 A * 12/1995 Eatwell ...................... 381/71.11
5,590,205 A * 12/1996 Popovich ................... 381/71.11
5,600,718 A * 2/1997 Dent et al. ............... 379/406.06
5,694,476 A * 12/1997 Klippel ........................... 381/96
5,715,320 A * 2/1998 Allie et al. ................. 381/71.12
(Continued)

FOREIGN PATENT DOCUMENTS

JP 60-204198 10/1985
(Continued)

OTHER PUBLICATIONS

European Search Report issued Mar. 3, 2011 in European Application No. 06 78 1958.

(Continued)

*Primary Examiner* — Elvin G Enad
*Assistant Examiner* — Christina Russell
(74) *Attorney, Agent, or Firm* — Wenderoth, Lind & Ponack, L.L.P.

(57) ABSTRACT

The loudspeaker device according to the present invention comprises a loudspeaker; a feedforward processing section for performing feedforward processing on an electric signal to be inputted to the loudspeaker based on a preset filter coefficient so that non-linear distortion which occurs from the loudspeaker is removed; and a feedback processing section for detecting vibration of the loudspeaker, and performing feedback processing on an electric signal concerning the vibration with respect to the electric signal to be inputted to the loudspeaker. The feedback processing section performs feedback processing on the electric signal concerning the vibration so that the non-linear distortion which occurs from the loudspeaker is removed and so that a frequency characteristic concerning the vibration of the loudspeaker becomes a predetermined frequency characteristic.

22 Claims, 24 Drawing Sheets

U.S. PATENT DOCUMENTS

| | | | | |
|---|---|---|---|---|
| 5,815,585 | A * | 9/1998 | Klippel | 381/96 |
| 5,848,169 | A * | 12/1998 | Clark et al. | 381/71.13 |
| 5,963,651 | A * | 10/1999 | Van Veen et al. | 381/71.11 |
| 6,005,952 | A * | 12/1999 | Klippel | 381/71.11 |
| 6,259,935 | B1 * | 7/2001 | Saiki et al. | 455/567 |
| 6,449,369 | B1 * | 9/2002 | Carme et al. | 381/71.12 |
| 7,053,705 | B2 * | 5/2006 | Hench et al. | 330/102 |
| 2001/0031052 | A1 * | 10/2001 | Lock et al. | 381/71.7 |
| 2005/0207584 | A1 * | 9/2005 | Bright | 381/59 |
| 2008/0112570 | A1 * | 5/2008 | Asada et al. | 381/71.6 |
| 2008/0159555 | A1 * | 7/2008 | Asada et al. | 381/71.11 |
| 2008/0310645 | A1 * | 12/2008 | Itabashi et al. | 381/71.6 |
| 2010/0028134 | A1 * | 2/2010 | Slapak et al. | 415/119 |

FOREIGN PATENT DOCUMENTS

| | | |
|---|---|---|
| JP | 10-276492 | 10/1998 |
| JP | 11-501170 | 1/1999 |
| JP | 11-46393 | 2/1999 |
| JP | 2002-333886 | 11/2002 |
| JP | 2003-324789 | 11/2003 |
| JP | 2005-184154 | 7/2005 |

OTHER PUBLICATIONS

International Search Report issued Oct. 10, 2006 in the International (PCT) Application of which the present application is the U.S. National Stage.

* cited by examiner

| | STIFFNESS kx | PHASE MARGIN | fgc |
|---|---|---|---|
| | 20000 | -0.849[° ] | 5.4[Hz] |
| INPUT |   | | |
| RESPONSE |   | | |

| | STIFFNESS kx | PHASE MARGIN | fgc |
|---|---|---|---|
| | 5000 | -1.7[° ] | 2.7[Hz] |
| INPUT |  | | |
| RESPONSE |  | | |

| | STIFFNESS kx | PHASE MARGIN | fgc |
|---|---|---|---|
| | 1200 | -3.46[° ] | 1.3[Hz] |

INPUT

RESPONSE

LOUDSPEAKER DEVICE

TECHNICAL FIELD

The present invention relates to a loudspeaker device, and more particularly to a loudspeaker device for removing distortion which occurs from a loudspeaker.

BACKGROUND ART

Conventionally, there has been a desire to faithfully convert an electric signal into a sound wave in a normal loudspeaker which does not perform electric signal processing. However, it is hard for an actual loudspeaker to perform faithful conversion due to limitations on its structure. For example, in a magnetic circuit constituting the loudspeaker, because of its structure, a magnetic flux density in a magnetic gap decreases as amplitude increases. Then, a force coefficient also decreases with the decrease of the magnetic flux density. The stiffness of a support system such as a damper, an edge, and the like changes according to the magnitude of the amplitude because of the structure of the support system. Due to these reasons, the amplitude of the loudspeaker is not necessarily proportional to the magnitude of the inputted electric signal, and there is a problem that non-linear distortion occurs.

As a method of removing the above non-linear distortion, conventionally, there has been proposed a method using electric signal processing such as feedforward processing, or the like. This processing method is a method in which polynomial approximation is performed on a parameter (a force coefficient according to a magnetic flux density, a stiffness of a support system, or the like) including a non-linear component of the loudspeaker and a filter coefficient is set so as to cancel non-linear distortion attributable to the parameter. An electric signal is inputted to the loudspeaker through a filter the filter coefficient of which is set, thereby removing the non-linear distortion. However, especially, the stiffness of the support system among the parameter changes hourly, and also ages. In other words, the value of the parameter changes over time. Thus, in the above feedforward processing, error between the preset value of the parameter and the actual value of the parameter becomes large over time, and there is a drawback that the above effect of distortion removal is significantly deteriorated.

For solving the above problem, in the feedforward processing, there has been proposed a method to adaptively update the parameter of the filter coefficient (e.g. refer to Patent Document 1). The following will describe this method with reference to FIG. 28. FIG. 28 is a block diagram showing a conventional loudspeaker device 9 which adaptively updates the parameter of the filter coefficient.

In FIG. 28, the conventional loudspeaker device 9 includes a control section 91, a parameter detector 92, and a loudspeaker 95. The parameter detector 92 includes an error circuit 93 and an update circuit 94. The error circuit 93 includes a filter (not shown), and calculates at the filter a pseudo vibration characteristic from a signal inputted from the control section 91. The error circuit 93 predictively calculates from the pseudo vibration characteristic a drive voltage which is applied to the loudspeaker 95. It is noted that the predicted drive voltage is equivalent to an impedance characteristic when the loudspeaker 95 is driven by a current. Then, the error circuit 93 produces an error signal e(t) by subtracting an actual drive voltage which is applied to the loudspeaker 95 from the predicted drive voltage. The error signal e(t) is inputted to the update circuit 94.

Based on the error signal e(t), the update circuit 94 calculates a parameter in the control section 91, which is to be updated. The parameter calculated by the update circuit 94 is reflected to the filter of the error circuit 93, and a gradient signal Sg is produced by the error circuit 93. The gradient signal Sg produced by the error circuit 93 is outputted to the update circuit 94 again. Thus, the update circuit 94 calculates a parameter using the above error signal e(t) and the gradient signal Sg so that the error signal e(t) becomes minimum. The parameter when the error signal e(t) becomes minimum is outputted as a power vector P to the control section 91, and the parameter in the control section 91 is updated. As described above, in the loudspeaker device 9 as shown in FIG. 28, the parameter is updated by the error circuit 93 and the update circuit 94 so that the parameter in the control section 91 corresponds to the parameter of the actual loudspeaker 95.

[Patent Document 1] Japanese Patent Laid-open Publication No. 11-46393

DISCLOSURE OF THE INVENTION

Problems to be Solved by the Invention

However, the error circuit 93 and the update circuit 94, which update the parameter, need complex and voluminous mathematical operations. Also, as described above, the stiffness of the support system changes hourly according to the magnitude of the electric signal inputted to the loudspeaker. In other words, since the conventional loudspeaker device 9 needs the complex and voluminous mathematical operations, it is extremely hard for the conventional loudspeaker device 9 to practically perform update processing of the parameter so as to follow the severe change of the above stiffness of the support system. As a result, the conventional loudspeaker device 9 has a problem that the effect of distortion removal is not sufficiently obtained and there is lack of the feasibility. In addition, since the conventional loudspeaker device 9 achieves the voluminous mathematical operations, the conventional loudspeaker device 9 has a problem that there is lack of cost performance.

Thus, an object of the present invention is to provide a loudspeaker device which performs signal processing so as to follow a change of the parameter in the actual loudspeaker and is capable of performing more stable distortion removal processing.

Solution to the Problems

A first aspect is a loudspeaker device comprising: a loudspeaker; a feedforward processing section for performing feedforward processing on an electric signal to be inputted to the loudspeaker based on a preset filter coefficient so that non-linear distortion which occurs from the loudspeaker is removed; and a feedback processing section for detecting vibration of the loudspeaker, and performing feedback processing on an electric signal concerning the vibration with respect to the electric signal to be inputted to the loudspeaker, wherein the feedback processing section performs feedback processing on the electric signal concerning the vibration so that the non-linear distortion which occurs from the loudspeaker is removed and so that a frequency characteristic concerning the vibration of the loudspeaker becomes a predetermined frequency characteristic.

In a second aspect according to the first aspect, the feedback processing section includes: a predetermined characteristic conversion filter for receiving the electric signal to be inputted to the loudspeaker, and converting the frequency characteristic of the received electric signal into the predetermined frequency characteristic; a sensor for detecting the vibration of the loudspeaker; a first adder for taking a difference between the electric signal which is converted by the predetermined characteristic conversion filter and indicates the predetermined frequency characteristic and the electric signal concerning the vibration which is detected by the sensor, and outputting an electric signal of the difference as an error signal; and a second adder for adding the electric signal which is processed by the feedforward processing section and the error signal, and outputting a resultant electric signal to the loudspeaker.

In a third aspect according to the second aspect, the filter coefficient of the feedforward processing section is a coefficient based on a parameter which is unique to the loudspeaker, and the feedforward processing section processes the electric signal to be inputted to the loudspeaker so that a non-linear component of the parameter is cancelled.

In a fourth aspect according to the second aspect, the filter coefficient of the feedforward processing section is a coefficient based on a parameter which is unique to the loudspeaker, and the parameter is a parameter which changes according to a vibration displacement of the loudspeaker.

In a fifth aspect according to the fourth aspect, the feedforward processing section includes: a removal filter for receiving the electric signal to be inputted to the loudspeaker, and processing the received electric signal based on the preset filter coefficient so that the non-linear distortion which occurs from the loudspeaker is removed; and a linear filter for receiving the electric signal to be inputted to the loudspeaker, and producing an electric signal which indicates a vibration displacement of the loudspeaker when the loudspeaker linearly vibrates, and the removal filter refers to the electric signal which is produced by the linear filter and indicates the vibration displacement.

In a sixth aspect according to the fifth aspect, the loudspeaker device further comprises an amplification section which is provided between the second adder and the loudspeaker for amplifying a gain of the electric signal to be inputted to the loudspeaker, and the filter coefficient of the removal filter, a filter coefficient of the predetermined characteristic conversion filter, and a filter coefficient of the linear filter are filter coefficients which are multiplied by an inverse number of a value of the gain which is amplified by the amplification section.

In a seventh aspect according to the fourth aspect, the electric signal detected by the sensor is an electric signal which indicates the vibration displacement of the loudspeaker, and the feedforward processing section refers to the electric signal which is detected by the sensor and indicates the vibration displacement.

In an eighth aspect according to the second aspect, the loudspeaker device further comprises a previous-stage filter which is provided in a stage prior to the feedforward processing section for receiving the electric signal to be inputted to the loudspeaker, and processing the received electric signal based on a filter coefficient which is obtained by subtracting a characteristic of the loudspeaker concerning the vibration from the predetermined frequency characteristic.

In a ninth aspect according to the second aspect, the loudspeaker device further comprises limit means for limiting a level of an electric signal so as not to input to the loudspeaker an electric signal a level of which is equal to or higher than a predetermined level.

In a tenth aspect according to the second aspect, the loudspeaker device further comprises an amplification section which is provided between the second adder and the loudspeaker for amplifying a gain of the electric signal to be inputted to the loudspeaker, and the filter coefficient of the feedforward processing section, and a filter coefficient of the predetermined characteristic conversion filter are filter coefficients which are multiplied by an inverse number of a value of the gain which is amplified by the amplification section.

In an eleventh aspect according to the first aspect, the feedforward processing section is provided in a position before the loudspeaker and provided in a feedback loop which is formed by the feedback processing section.

In a twelfth aspect according to the first aspect, the feedback processing section includes: a predetermined characteristic conversion filter for receiving the electric signal to be inputted to the loudspeaker, and converting the frequency characteristic of the received electric signal into the predetermined frequency characteristic; a sensor for detecting the vibration of the loudspeaker; a first adder for taking a difference between the electric signal which is converted by the predetermined characteristic conversion filter and indicates the predetermined frequency characteristic and the electric signal concerning the vibration which is detected by the sensor, and outputting an electric signal of the difference as an error signal; and a second adder for adding the electric signal to be inputted and the error signal, and outputting a resultant electric signal to the feedforward processing section, and the feedforward processing section performs feedforward processing on the electric signal outputted from the second adder so that the non-linear distortion which occurs from the loudspeaker is removed, and outputs a resultant electric signal to the loudspeaker.

In a thirteenth aspect according to the twelfth aspect, the loudspeaker device further comprises a first filter which is provided between the second adder and the feedforward processing section, and has a filter coefficient for a gain of the electric signal to be inputted to the loudspeaker to indicate a characteristic which is inclined at a gradient of −6 dB/oct or less in a frequency band which is equal to or lower than a first frequency, and the first frequency is a frequency which is equal to or higher than a gain crossover frequency indicated by an open-loop transfer characteristic of a feedback loop which is formed by the feedback processing section.

In a fourteenth aspect according to the twelfth aspect, the loudspeaker device further comprises a second filter which is provided in a stage prior to the feedforward processing section, and has a filter coefficient for a gain of the electric signal to be inputted to the loudspeaker to indicate a characteristic which is inclined at a gradient of 6 dB/oct or more in a frequency band which is equal to or lower than a second frequency, and the second frequency is a frequency which is equal to or higher than a gain crossover frequency indicated by an open-loop transfer characteristic of a feedback loop which is formed by the feedback processing section.

In a fifteenth aspect according to the twelfth aspect, the loudspeaker device further comprises: a first filter which is provided between the second adder and the feedforward processing section, and has a filter coefficient for a gain of the electric signal to be inputted to the loudspeaker to indicate a characteristic which is inclined at a gradient of −6 dB/oct or less in a frequency band which is equal to or lower than a first frequency; and a second filter which is provided in a stage prior to the feedforward processing section, and has a filter coefficient for the gain of the electric signal to be inputted to the loudspeaker to indicate a characteristic which is inclined at a gradient of 6 dB/oct or more in a frequency band which is equal to or lower than a second frequency, and the first and second frequencies are frequencies which are equal to or higher than a gain crossover frequency indicated by an open-loop transfer characteristic of a feedback loop which is formed by the feedback processing section.

In a sixteenth aspect according to the twelfth aspect, the filter coefficient of the feedforward processing section is a coefficient based on a parameter which is unique to the loudspeaker, and the feedforward processing section processes the electric signal outputted from the second adder so that a non-linear component of the parameter is cancelled.

In a seventeenth aspect according to the twelfth aspect, the filter coefficient of the feedforward processing section is a coefficient based on a parameter which is unique to the loudspeaker, and the parameter is a parameter which changes according to a vibration displacement of the loudspeaker.

In an eighteenth aspect according to the seventeenth aspect, the feedforward processing section includes: a removal filter for receiving the electric signal outputted from the second adder, and processing the received electric signal based on the preset filter coefficient so that the non-linear distortion which occurs from the loudspeaker is removed; and a linear filter for receiving the electric signal outputted from the second adder, and producing an electric signal which indicates a vibration displacement of the loudspeaker when the loudspeaker linearly vibrates, and the removal filter refers to the electric signal which is produced by the linear filter and indicates the vibration displacement.

In a nineteenth aspect according to the eighteenth aspect, the loudspeaker device further comprises an amplification section which is provided between the feedforward processing section and the loudspeaker for amplifying a gain of the electric signal to be inputted to the loudspeaker, and the filter coefficient of the removal filter, a filter coefficient of the predetermined characteristic conversion filter, and a filter coefficient of the linear filter are filter coefficients which are multiplied by an inverse number of a value of the gain which is amplified by the amplification section.

In a twentieth aspect according to the seventeenth aspect, the electric signal detected by the sensor is an electric signal which indicates the vibration displacement of the loudspeaker, and the feedforward processing section refers to the electric signal which is detected by the sensor and indicates the vibration displacement.

In a twenty-first aspect according to the twelfth aspect, the loudspeaker device further comprises a previous-stage filter which is provided in a position before the second adder for receiving the electric signal to be inputted to the loudspeaker, and processing the received electric signal based on a filter coefficient which is obtained by subtracting a characteristic of the loudspeaker concerning the vibration from the predetermined frequency characteristic.

In a twenty-second aspect according to the twelfth aspect, the loudspeaker device further comprises limit means for limiting a level of an electric signal so as not to input to the loudspeaker an electric signal a level of which is equal to or higher than a predetermined level.

In a twenty-third aspect according to the twelfth aspect, the loudspeaker device further comprises an amplification section which is provided between the feedforward processing section and the loudspeaker for amplifying a gain of the electric signal to be inputted to the loudspeaker, and the filter coefficient of the feedforward processing section, and a filter coefficient of the predetermined characteristic conversion filter are filter coefficients which are multiplied by an inverse number of a value of the gain which is amplified by the amplification section.

A twenty-fourth aspect is an integrated circuit comprising: a feedforward processing section for performing feedforward processing on an electric signal to be inputted to a loudspeaker based on a preset filter coefficient so that non-linear distortion which occurs from the loudspeaker is removed; and a feedback processing section for detecting vibration of the loudspeaker, and performing feedback processing on an electric signal concerning the vibration with respect to the electric signal to be inputted to the loudspeaker, and the feedback processing section performs feedback processing on the electric signal concerning the vibration so that the non-linear distortion which occurs from the loudspeaker is removed and so that a frequency characteristic according to the vibration of the loudspeaker becomes a predetermined frequency characteristic.

Effect of the Invention

According to the first aspect, most of the non-linear distortion can be removed by the feedforward processing based on the preset filter coefficient. Further, robust distortion removal with respect to, for example, the secular change of the stiffness of the support system of the loudspeaker, and the like can be performed by the feedback processing. In other words, according to the present aspect, the feedforward processing section performs processing based on the preset filter coefficient, and the feedback processing section performs the above robust distortion removal, thereby providing a loudspeaker device which is capable of performing more stable distortion removal processing with high feasibility, without performing processing of updating the parameter of the loudspeaker. Further, according to the present aspect, the frequency characteristic concerning the vibration of the loudspeaker can be approximated to the predetermined frequency characteristic by the feedback processing.

According to the second aspect, most of the non-linear distortion can be removed by the feedforward processing based on the preset filter coefficient, and the robust distortion removal with respect to, for example, the secular change of the stiffness of the support system of the loudspeaker, and the like can be performed by the feedback processing based on the error signal. Thus, a loudspeaker device can be provided which is capable of performing more stable distortion removal processing with high feasibility. Further, according to the present aspect, the frequency characteristic concerning the vibration of the loudspeaker can be approximated to the predetermined frequency characteristic by the predetermined characteristic conversion filter.

According to the third aspect, the non-linear distortion which occurs from the loudspeaker can be removed more effectively by processing the electric signal to be inputted to the loudspeaker so that the non-linear component of the parameter is cancelled.

According to the fourth aspect, high-accurate distortion removal processing according to the vibration displacement of the loudspeaker can be performed.

According to the fifth aspect, processing based on the vibration displacement when the loudspeaker vibrates linearly is possible, and more highly efficient distortion removal processing can be performed.

According to the sixth aspect, even in the case where a voltage which can be handled in internal arithmetic in the removal filter, the predetermined characteristic conversion filter, and the linear filter is small, processing with the effect of distortion removal maintained is possible. In addition, by providing the amplification section in the feedback loop, a feedback gain can become large, and the effect of distortion reduction can be improved.

According to the seventh aspect, distortion removal processing according to the vibration of the actual loudspeaker can be performed.

According to the eighth aspect, in the characteristic concerning the vibration which is outputted from the loudspeaker, convergence to the predetermined frequency characteristic can be enhanced.

According to the ninth aspect, the loudspeaker can be prevented from being damaged due to an excessive input.

According to the tenth aspect, even in the case where a voltage which can be handled in internal arithmetic in the feedforward processing section and the predetermined characteristic conversion filter is small, processing with the effect of distortion removal maintained is possible. In addition, by providing the amplification section in the feedback loop, the feedback gain can become large, and the effect of distortion reduction can be improved.

According to the eleventh aspect, by locating the feedforward processing section in the feedback loop, the effect of distortion removal can be achieved to a lower-frequency band even when the amplitude of the loudspeaker becomes large.

According to the twelfth aspect, by locating the feedforward processing section in the feedback loop, the effect of distortion removal can be achieved to a lower-frequency band even when the amplitude of the loudspeaker becomes large.

According to the thirteenth aspect, since the gain crossover frequency is lowered by the first filter, the effect of distortion removal can be achieved to the lower-frequency band.

According to the fourteenth aspect, since an electric signal of a frequency which is equal to or lower than the gain crossover frequency is not inputted by the second filter, distortion which occurs by inputting an electric signal of a frequency which is equal to or lower than the gain crossover frequency can be removed in advance, and the higher effect of distortion removal can be obtained.

According to the fifteenth aspect, since the gain crossover frequency is lowered by the first filter, the effect of distortion removal can be achieved to the lower-frequency band. Further, since an electric signal of a frequency which is equal to or lower than the gain crossover frequency is not inputted by the second filter, the distortion which occurs by inputting an electric signal of a frequency which is equal to or lower than the gain crossover frequency can be removed in advance, and the higher effect of distortion removal can be obtained.

DESCRIPTION OF THE REFERENCE CHARACTERS

Figure 1:
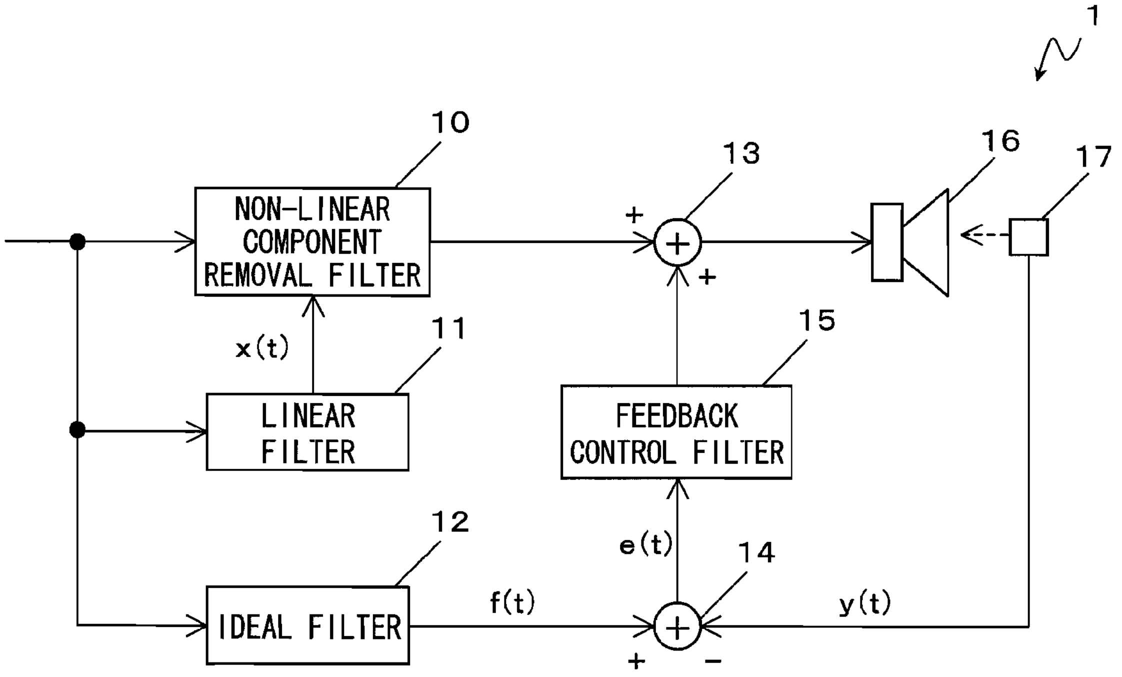
FIG. 1 is a block diagram showing an exemplary configuration of a loudspeaker device 1 according to a first embodiment.

1, 2 loudspeaker device
10 non-linear component removal filter
11 linear filter
12 ideal filter
13, 14 adder
15 feedback control filter
16 loudspeaker
17 sensor
20 previous-stage filter

21 compensating filter
22 high-pass filter
23 power amplifier
24 limiter
161 voice coil
162 diaphragm
163 magnet
164 magnetic circuit
165 magnetic gap
166 damper
167 edge

BEST MODE FOR CARRYING OUT THE INVENTION

The following will describe embodiments of the present invention with reference to the figurers.

First Embodiment

With reference to FIG. 1, a loudspeaker device 1 according to a first embodiment of the present invention will be described. FIG. 1 is a block diagram showing an exemplary configuration of the loudspeaker device 1 according to the first embodiment. As shown in FIG. 1, the loudspeaker device 1 comprises a non-linear component removal filter 10, a linear filter 11, an ideal filter 12, adders 13 and 14, a feedback control filter 15, a loudspeaker 16, and a sensor 17.

Figure 2:
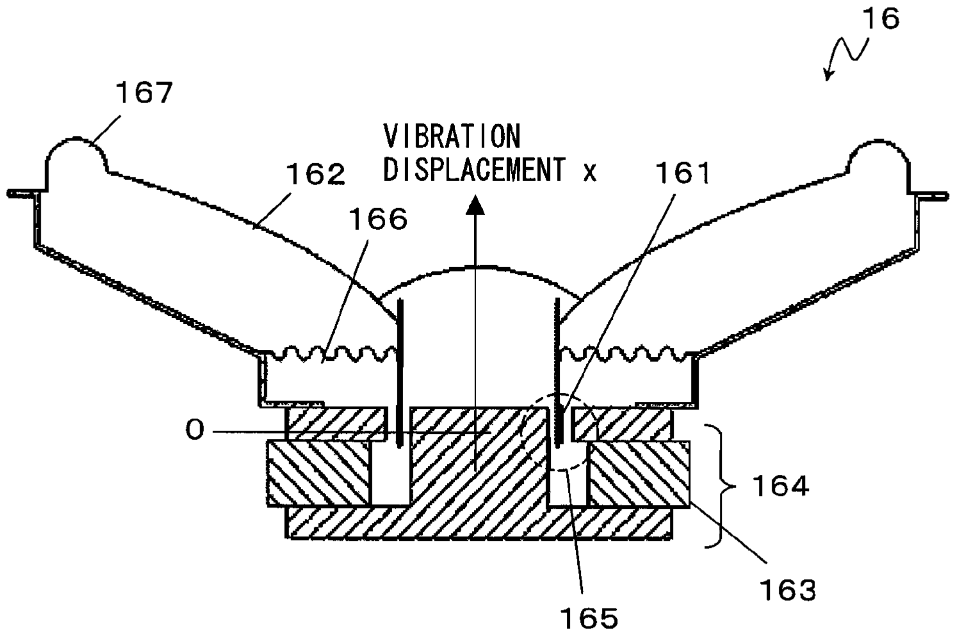
FIG. 2 is a cross-sectional view of a common loudspeaker 16.
Figure 3:
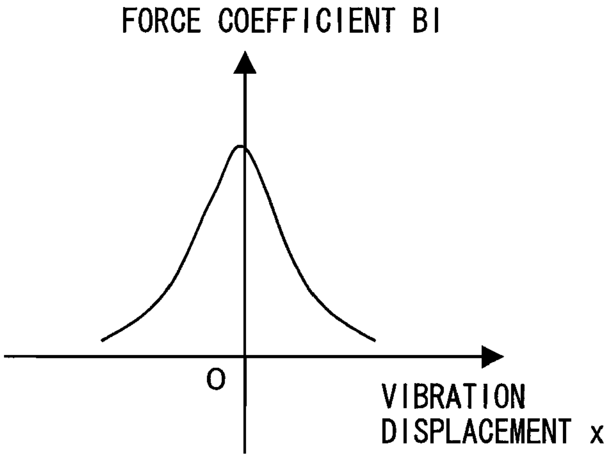
FIG. 3 shows an example of a characteristic of a force coefficient Bl with respect to a vibration displacement x in the vicinity of a magnetic gap 165.
Figure 4:
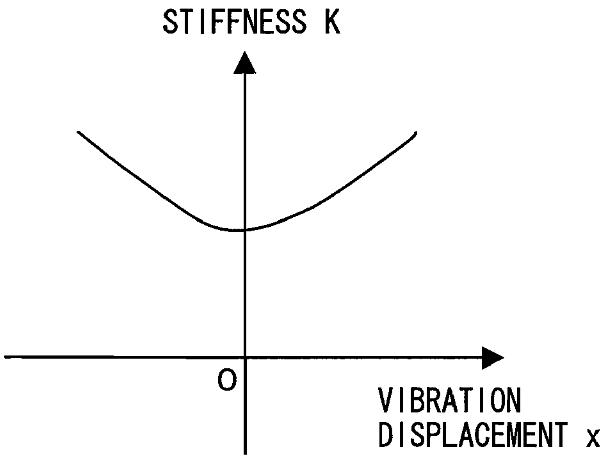
FIG. 4 shows an example of a stiffness K of a support system with respect to the vibration displacement x.
Figure 5:
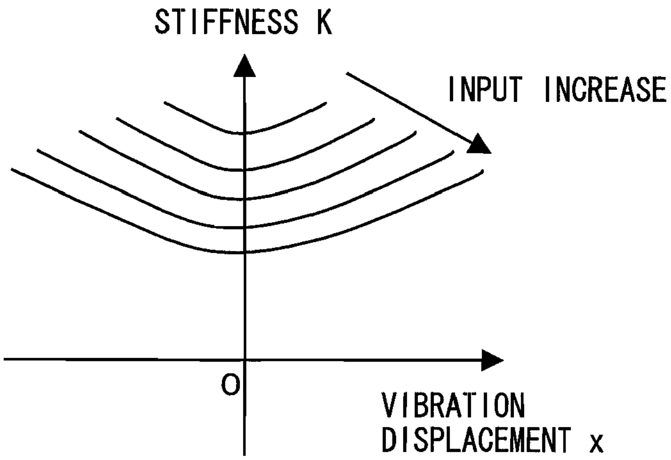
FIG. 5 shows change of the stiffness K with respect to an input signal I(t).

Here, with reference to FIG. 2, the cause of occurrence of non-linear distortion in the loudspeaker 16 will be described. FIG. 2 is a cross-sectional view of the common loudspeaker 16. As shown in FIG. 2, the loudspeaker 16 comprises a voice coil 161, a diaphragm 162, a magnet 163, a magnetic circuit 164, a damper 166, and an edge 167. The magnetic gap 165 is formed in the magnetic circuit 164 shown in FIG. 2. According to the Fleming's left-hand rule with a magnetic flux density B in the magnetic gap 165 and a current flowing through the voice coil 161, the voice coil 161 vibrates together with the diaphragm 162 in the axial direction of a vibration displacement x. The diaphragm 162 is supported by the damper 166 and the edge 167, so that the diaphragm 162 is vibrated stably in the axial direction of the vibration displacement x to emit sound. It is noted that the loudspeaker 16 shown in FIG. 2 is an example, and it is not limited thereto. For example, it may be a shielded loudspeaker including a cancel magnet, or a loudspeaker which includes a magnetic circuit of an internal magnetic type. In addition, in FIG. 2, a position where the vibration displacement x is zero indicates the center position of the vibration of the voice coil 161 and the diaphragm 162, and corresponds to an origin where the later-described vibration displacements x shown in FIGS. 3 to 5 is zero.

In the loudspeaker 16, the cause of occurrence of non-linear distortion includes mainly three causes. The first cause relates to the magnetic flux density B which occurs in the magnetic gap 165. FIG. 3 shows an example of a force coefficient Bl with respect to the vibration displacement x in the vicinity of the magnetic gap 165. When the amplitude of the voice coil 161 is small, namely, when the absolute value of the vibration displacement x is small (x is around zero), the magnetic flux density B is roughly constant. However, when the amplitude of the voice coil 161 is large, namely, when the absolute value of the vibration displacement x is large, the magnetic flux density B decreases rapidly. This is because a magnetic path is hard to form as being distant from the vicinity of the center of the magnetic gap 165 (x is around zero) in the axial direction of the vibration displacement x. Thus, a relation between the force coefficient Bl obtained by the magnetic flux density B and the vibration displacement x of the voice coil 161 is a relation as shown in FIG. 3. It is noted that the characteristic of the force coefficient Bl shown in FIG. 3 changes according to the vibration displacement x, and is expressed as a function Bl(x) of the vibration displacement x.

Here, where the current of an input signal flowing through the voice coil 161 is denoted by I(t), a driving force F(t) which vibrates the voice coil 161 is expressed by the following equation (1).

$$F(t)=Bl(x)*I(t) \tag{1}$$

As shown in FIG. 3, as the amplitude of the voice coil 161 increases, the value of the force coefficient Bl(x) decreases. Therefore, according to the equation (1), the driving force F(t) is not proportional to the level of the input signal I(t) when the amplitude is large. In addition, if the driving force F(t) is not proportional to the level of the input signal I(t), it is obvious that the vibration displacement x is also not proportional to the level of the input signal I(t). Thus, non-linear distortion occurs from the loudspeaker 16.

The second cause relates to a support system such as the damper 166, the edge 167, and the like. The damper 166 and the edge 167 do not infinitely stretch because of their shapes, and begin to tense when stretching to some extent. FIG. 4 shows an example of a characteristic of a stiffness K of the support system with respect to the vibration displacement x. As shown in FIG. 4, when the amplitude of the voice coil 161 is small, namely, when the absolute value of the vibration displacement x is small, the stiffness K is roughly constant. However, when the amplitude of the voice coil 161 is large, namely, when the absolute value of the vibration displacement x is large, the value of the stiffness K becomes large. Thus, when the amplitude becomes large, the value of the stiffness K changes, and the vibration displacement x is not proportional to the driving force F(t). In addition, if the vibration displacement x is not proportional to the driving force F(t), according to the above equation (1), the vibration displacement x is not proportional to the level of the input signal I(t). As a result, non-linear distortion occurs from the loudspeaker 16.

FIG. 5 shows change of the characteristic of the stiffness K with respect to the input signal I(t). As shown in FIG. 5, the characteristic of the stiffness K changes according to the magnitude of the level of I(t), and does not constantly provide a constant curve. Since the damper 166 and the edge 167 are each made of a material such as a cloth, a resin, or the like, the characteristic of the stiffness K shown in FIG. 4 changes even due to a secular change and a creep phenomenon of the material. The vibration displacement x is not proportional to the level of input signal I(t) even due to these causes, and non-linear distortion occurs from the loudspeaker 16.

The third cause relates to an electrical impedance characteristic of the voice coil 161. A high-permeability material such as iron, or the like is used for the magnetic circuit of the loudspeaker. Thus, an inductance component included in the voice coil 161 changes according to the magnitude of the amplitude. The voice coil 161 generate heat when an electric signal is inputted thereto. Thus, a resistance component of the voice coil 161 changes over time. Due to these factors, the current flowing through the voice coil 161 is distorted, and non-linear distortion occurs from the loudspeaker 16. Due to the above three main causes, non-linear distortion occurs from the loudspeaker 16.

It is noted that when the loudspeaker 16 is driven by a constant voltage, a relation between a voltage E(t) of the input signal inputted to the loudspeaker 16 and the vibration displacement x(t) is generally expressed by the following equation (2).

$$Bl*E(t)/Ze=K*x(t)+(r+Bl^2/Ze)*dx(t)/dt+m*d^2x(t)/dt^2 \quad (2)$$

It is noted in the equation (2), the stiffness of the support system is denoted by K, a mechanical resistance of the loudspeaker 16 is denoted by r, an electrical impedance of the voice coil 161 is denoted by Ze, and a vibration system mass is denoted by m.

Here, among the above three causes, in non-linear distortion occurring in a low-frequency band, especially, the effect by the force coefficient Bl and the parameter of the stiffness K is large. When the force coefficient Bl and the stiffness K shown in FIGS. 3 and 4 are expressed as a function of the vibration displacement x in the equation (2), the following equation (3) is provided.

$$Bl(x)*E(t)/Ze=K(x)*x(t)+(r+Bl(x)^2/Ze)*dx(t)/dt+m*d^2x(t)/dt^2 \quad (3)$$

In addition, when polynomial approximation is performed on Bl(x) and K(x) with respect to the vibration displacement x and Bl(x) and K(x) are modeled, the following equations (4) and (5) are provided.

$$Bl(x)=A0+A1*x+A2*x^2+A3*x^3+\ldots \quad (4)$$

$$K(x)=K0+K1*x+K2*x^2+K3*x^3+\ldots \quad (5)$$

In the above equation (4) and the above equation (5), A0 and K0 are parameters of a linear component which are independent from the vibration displacement x. Thus, when the equation (4) and the equation (5) are each separated into the linear component and the non-linear component, and expressed, they are expressed as equation (6) and equation (7), respectively.

$$Bl(x)=A0+Ax \quad (6)$$

$$K(x)=K0+Kx \quad (7)$$

It is noted that Ax is the non-linear component of Bl(x), and Kx is the non-linear component of K(x). Thus, when the equation (6) and the equation (7) are substituted for Bl(x) and K(x) in the equation (3), equation (8) is provided.

$$(A0+Ax)*E(t)/Ze=(K0+Kx)*x(t)+[r+(A0+Ax)^2/Ze]*dx(t)/dt+m*d^2x(t)/dt^2 \quad (8)$$

The following will describe operation processing of the loudspeaker device 1 shown in FIG. 1. In the loudspeaker device 1 according to the present embodiment, roughly, feedforward processing by the non-linear component removal filter 10 and the linear filter 11, and feedback processing by the ideal filter 12, the sensor 17, the adder 14, the feedback control filter 15, and the adder 13 are performed. Thus, the non-linear component removal filter 10 and the linear filter 11 correspond to a feedforward processing section of the present invention. Also, the ideal filter 12, the sensor 17, the adder 14, the feedback control filter 15, and the adder 13 correspond to a feedback processing of the present invention.

The feedforward processing by the non-linear component removal filter 10 and the linear filter 11 will be described. An electric signal is inputted as an input signal to the non-linear component removal filter 10, the linear filter 11, and the ideal filter 12. The processing of the ideal filter 12 will be described later.

The non-linear component removal filter 10 processes the input signal so as to cancel the non-linear component of the modeled parameter based on a predetermined filter coefficient which is obtained by referring to the vibration displacement x(t) in a pseudo linear operation produced by the linear filter 11. Then, the signal processed by the non-linear component removal filter 10 is outputted to the adder 13. The following will describe the predetermined filter coefficient which is set at the non-linear component removal filter 10.

An operation equation of the loudspeaker 16 is as shown by the above equation (8). According to the above equation (8), an operation equation which does not include the non-linear components (Blx and Kx) of the parameter, namely, an operation equation in the linear operation in which non-linear distortion does not occur is the following equation (9).

$$A0*E(t)/Ze=K0*x(t)+[r+A0^2/Ze]*dx(t)/dt+m*d^2x(t)/dt^2 \quad (9)$$

Therefore, when the equation (9) is subtracted from the equation (8), an operation equation including only the non-linear components of the loudspeaker is taken out as equation (10).

$$Ax*E(t)/Ze=Kx*x(t)+[(2*A0*Ax+A0^2)/Ze]*dx(t)/dt \quad (10)$$

In addition, when the equation (10) is subtracted from the equation (8), an operation equation in which the non-linear components of the loudspeaker are removed is taken out as equation (11):

$$(A0+Ax)*E(t)/Ze-Ax*E(t)/Ze=(K0+Kx)*x(t)+[r+(A0+Ax)^2/Ze]*dx(t)/dt+m*d^2x(t)/dt^2-Kx*x(t)+[(2*A0*Ax+A0^2)/Ze]*dx(t)/dt. \quad (11)$$

Here, when the right side of the equation (11) is made equal to the right side of the equation (8) which is the original operation equation of the loudspeaker 16, the equation (11) is expressed as equation (12).

$$(A0+Ax)*E(t)/Ze-Ax*E(t)/Ze+Kx*x(t)+[(2*A0*Ax+A0^2)/Ze]*dx(t)/dt=(K0+Kx)*x(t)+[r+(A0+Ax)^2/Ze]*dx(t)/dt+m*d^2x(t)/dt^2 \quad (12)$$

When the left side of the equation (12) is arranged, equation (13) is obtained. The left side of the equation (13) is a filter coefficient for cancelling the non-linear component of the parameter.

$$(A0+Ax)/Ze*[E(t)-Ze/(A0+Ax)*(Ax/Ze*E(t)-(2*A0*Ax+Ax^2)/Ze*dx(t)/dt-Kx*x(t))]=(K0+Kx)*x(t)+[r+(A0+Ax)^2/Ze]*dx(t)/dt+m*d^2x(t)/dt^2 \quad (13)$$

It is noted that in the above filter coefficient, the parameters A0 and Ax concerning the above force coefficient Bl, the parameters K0 and Kx concerning the stiffness K, and the electrical impedance Ze are unique parameters which the connected loudspeaker 16 has, and are preset parameters which constitute the filter coefficient of the non-linear component removal filter 10. In addition, from the left side of the equation (13), it is seen that the value of the vibration displacement x(t) is needed as a parameter needed for the filter coefficient of the non-linear component removal filter 10. The vibration displacement x(t) is produced by the linear filter 11 which will be described next.

Based on the preset filter coefficient, the linear filter 11 produces the vibration displacement x(t) when it is assumed that the loudspeaker 16 performs a linear operation from the input signal. In other words, the linear filter 11 produces the vibration displacement x(t) in the pseudo linear operation. As described above, the operation equation in the linear operation of the loudspeaker 16 is as described by the equation (9). Therefore, when a transfer function is obtained by performing Laplace transform on the equation (9), the following equation (14) is obtained. The right side of the equation (14) is the filter coefficient of the linear filter 11. It is noted that x(s) denotes a transfer function of the vibration displacement x(t), E(s) denotes a transfer function of the voltage of the input signal.

$$x(s)/E(s)=(A0/Ze)/[K0+s*(r+A0^2/Ze)+s^2*m] \quad (14)$$

As described above, by the feedforward processing by the non-linear component removal filter 10 and the linear filter 11, the non-linear components of the force coefficient Bl(x) and the stiffness K(x) which are modeled are cancelled as shown by the equation (8). Thus, non-linear distortion attributable to these non-linear components can be removed. In addition, the feedforward processing cancels the non-linear components so that the loudspeaker 16 performs the linear operation. Since the non-linear component removal filter 10 refers to the vibration displacement x(t) in the linear operation of the loudspeaker 16, more highly efficient effect of distortion removal is obtained.

The following will describe the feedback processing by the ideal filter 12, the sensor 17, the adder 14, the feedback control filter 15, and the adder 13.

Figure 6:
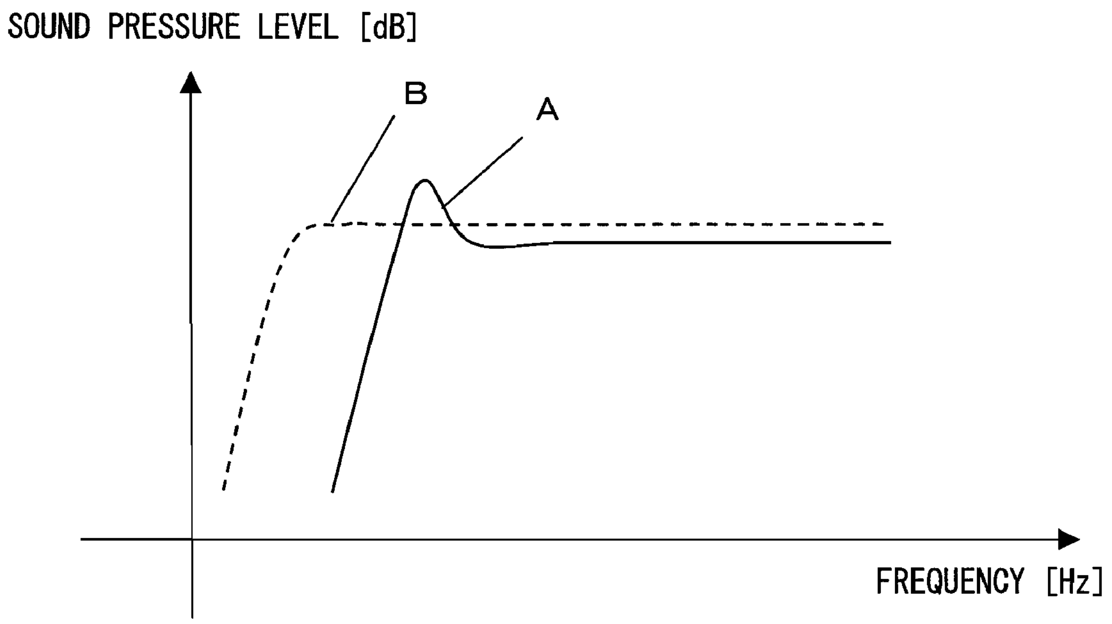
FIG. 6 shows a desired output characteristic which is set as a filter coefficient of an ideal filter 12.

The ideal filter 12 is a filter which has, as a filter coefficient, a transfer function F(s) of the desired output characteristic in the case where a characteristic (hereafter, referred to as an output characteristic) according to the vibration of the loudspeaker 16 is a desired output characteristic. In other words, the ideal filter 12 is a filter which converts the frequency characteristic of the input signal into the desired output characteristic. Here, the signal the frequency characteristic of which is converted into the desired output characteristics is referred to as a desired characteristic signal f(t). The desired characteristic signal f(t) is outputted to the adder 14. It is noted that the output characteristic of the loudspeaker 16 includes various characteristics such as a vibration displacement characteristic, a velocity characteristic, an acceleration characteristic (a sound pressure characteristic), and the like. For example, as shown in FIG. 6, it is assumed that a sound pressure frequency characteristic (a acceleration characteristic) of the actual loudspeaker 16 is a characteristic shown by A of FIG. 6. FIG. 6 shows a desired output characteristic which is set as a filter coefficient of the ideal filter 12. In FIG. 6, in the case where the sound pressure frequency characteristic of the loudspeaker 16 is caused to be a flat characteristic with a widened frequency range as a characteristic shown by B, a transfer function F(s) of the characteristic shown by B may be set as the filter coefficient of the ideal filter 12.

The sensor 17 detects the vibration of the loudspeaker 16, and outputs a detection signal y(t) having the output characteristic of the loudspeaker 16. The detection signal y(t) outputted from the sensor 17 is appropriately amplified, and outputted to the adder 14. It is noted that the sensor 17 is, for example, a microphone, a laser displacement meter, an acceleration pickup, or the like. Here, a signal characteristic outputted to the adder 14 is of the same kind as that of the output characteristic which the above desired characteristic signal f(t) has. In other words, in the ideal filter 12, in the case where the output characteristic which the desired characteristic signal f(t) is, for example, the vibration displacement characteristic of the loudspeaker 16, the signal outputted to the adder 14 is a signal of the vibration displacement characteristic. It is noted in this case, a sensor which detects the vibration of the loudspeaker 16 and outputs its vibration displacement may be used as the sensor 17. Or, even if a sensor which outputs the velocity characteristic or the acceleration characteristic of the loudspeaker 16 is used as the sensor 17, a differentiating circuit and an integrating circuit may appropriately provided between the sensor 17 and the adder 14 to convert into a vibration displacement characteristic a kind of the characteristic of a signal outputted to the adder 14.

It is noted that the sound pressure frequency characteristic of the loudspeaker is a characteristic proportional to an acceleration characteristic. Thus, when the characteristic of the desired characteristic signal f(t) outputted from the ideal filter 12 indicates the acceleration characteristic of the loudspeaker 16 and the sensor 17 is the acceleration pickup and the characteristic of the signal outputted from the sensor 17 indicates an acceleration characteristic, the effect of distortion removal becomes the highest.

Hereinafter, for explanation, it is assumed that the characteristic of the detection signal y(t) outputted from the sensor 17 is of the same kind as that of the desired characteristic signal f(t) outputted from the ideal filter 12. In other words, the case where a differentiating circuit and an integrating circuit do not need to be provided between the sensor 17 and the adder 14 is considered.

The adder 14 subtracts the detection signal y(t) outputted by the sensor 17 from the desired characteristic signal f(t) outputted from the ideal filter 12, and outputs the subtracted signal (f(t)−y(t)) as an error signal e(t) to the feedback control filter 15. The gain or the like of the error signal e(t) are adjusted by the feedback control filter 15, and the error signal e(t) is returned and inputted to the adder 13. Then, the output signal of the non-linear component removal filter 10 and the error signal e(t) outputted from the feedback control filter 15 are added by the adder 13, and outputted to the loudspeaker 16. It is noted that the feedback control filter 15 is basically a filter which adjusts a gain, namely, an amplifier, and the effect of distortion removal becomes larger as the gain is large.

Here, as described above, the stiffness K of the support system ages. Also, as shown in FIG. 5, the characteristic of the stiffness K changes according to the magnitude of the input. In this case, the output characteristic of the loudspeaker 16 also changes. On the other hand, the sensor 17 detects the changed output characteristic of the loudspeaker 16, and the above error signal e(t) is a signal of the difference between the detection signal y(t) outputted from the sensor 17 and a desired characteristic signal r(t). Thus, the secular change of the above stiffness K and the change of its characteristic by the magnitude of the input are reflected to the error signal e(t). The error signal e(t) is returned and inputted to the adder 13 through the feedback control filter 15, thereby canceling the secular change of the above stiffness K and the change of its characteristic by the magnitude of the input.

As described above, robust distortion removal processing with respect to the secular change of the stiffness K of the support system and the change of its characteristic by the magnitude of the input can be performed by the feedback processing by the ideal filter 12, the sensor 17, the adder 14, the feedback control filter 15, and the adder 13.

The change of the electrical impedance characteristic of the voice coil 161 (especially, change by heat generation), which is the above third cause of occurrence of non-linear distortion, is also included in the above error signal e(t). Thus, the non-linear distortion by this change can be removed by the above feedback processing.

In producing the error signal e(t), a signal f(t) having the desired output characteristic (the transfer function F(s)) is used at the ideal filter 12. The output characteristic of the actual loudspeaker 16 can be approximated to the above desired output characteristic by performing feedback processing on the error signal e(t).

As described above, according to the loudspeaker device 1 of the present embodiment, most of the non-linear distortion of the loudspeaker can be removed by the feedforward processing, and the robust distortion removal processing with respect to the secular change of the stiffness of the support system and the change of its characteristic by the magnitude of the input can be performed by the feedback processing. Thus, an adaptive parameter update circuit which requires complex and voluminous calculations is not needed, cost is prevented from being increased, and a loudspeaker device can be provided which is capable of performing more stable distortion removal processing with high feasibility.

It is noted that the above feedback control filter 15 may have a characteristic of, for example, a low-pass filter, or the like, in addition to gain adjustment. For example, there is the case where intermediate-frequency and high-frequency characteristics of the loudspeaker 16 are substantially disturbed and when the error signal e(t) is fed back as it is, there is a fear that oscillation occurs. At this time, the feedback control filter 15 is made to have the characteristic of the low-pass filter to cut intermediate-frequency and high-frequency components, thereby preventing the oscillation. In the loudspeaker device 1 shown in FIG. 1, if there is no fear of the oscillation by the error signal e(t) and gain adjustment is not needed, the feedback control filter 15 may be omitted.

In the above non-linear component removal filter 10, the non-linear distortion attributable to the force coefficient Bl and the stiffness K of the support system is removed by using the filter coefficient shown by the equation (13) derived from the equation (8), but it is not limited thereto. In the equation (8), further, the above electrical impedance characteristic Ze of the voice coil 161 is reflected as a function Ze(x) of the vibration displacement x, and the filter coefficient which takes the electrical impedance characteristic Ze into consideration may beset from the equation (14). Thus, in the feed-forward processing by the non-linear component removal filter 10 and the linear filter 11, non-linear distortion by the change based on the vibration displacement x(t) of the electrical impedance characteristic Ze can be removed.

Figure 7:
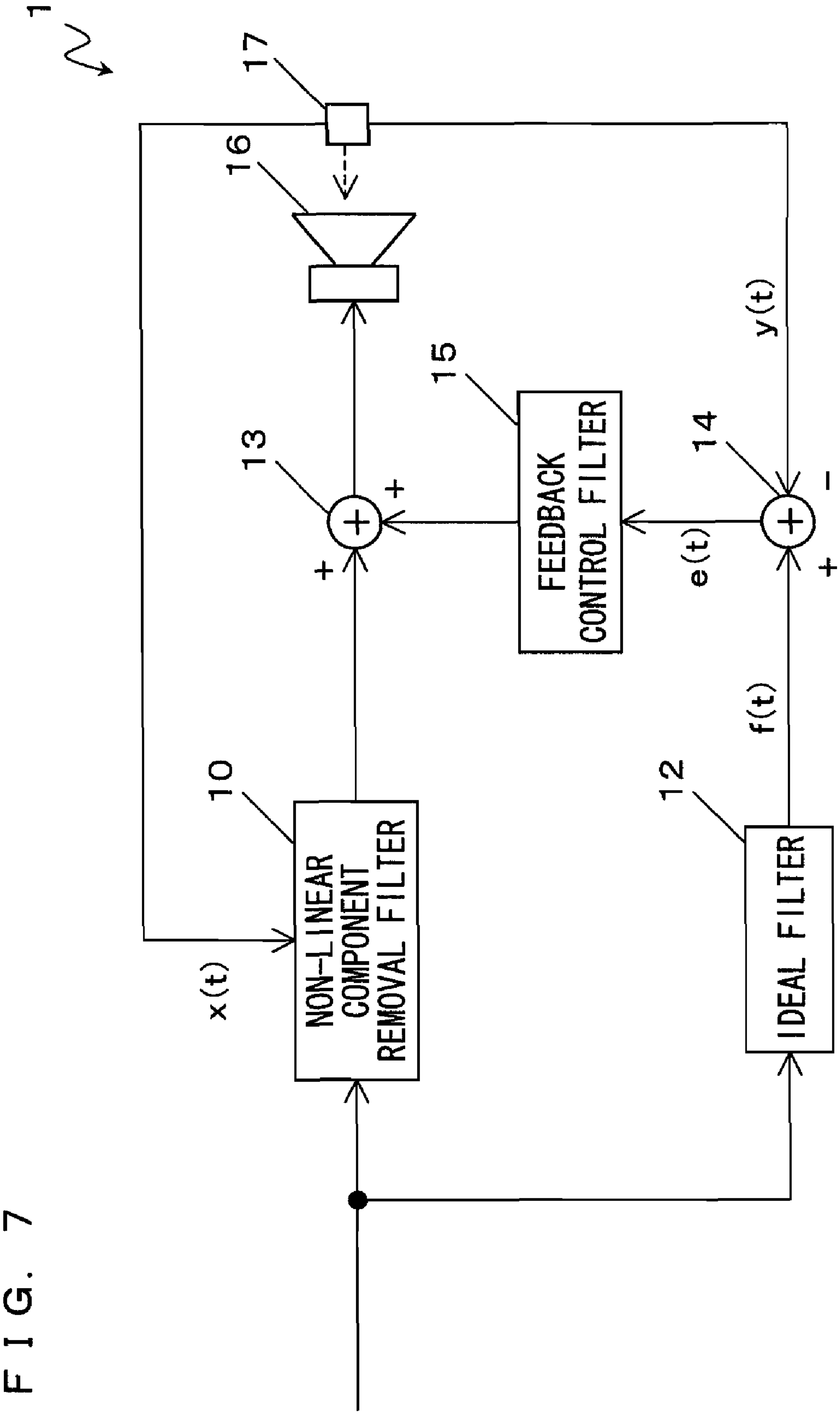
FIG. 7 is a block diagram showing an exemplary configuration of the loudspeaker device 1 in the case where a non-linear component removal filter 10 refers to an output signal of a sensor 17.

In addition, the above non-linear component removal filter 10 refers to the vibration displacement x(t) in the pseudo linear operation produced by the linear filter 11, but may refer directly to the output signal of the sensor 17 as shown in FIG. 7. In other words, the linear filter 11 can be omitted by referring directly to the output of the sensor 17. In this case, the vibration displacement x(t) is the vibration displacement x(t) of the actual loudspeaker, and the non-linear component removal filter 10 can perform processing according to the vibration displacement of the actual loudspeaker. It is noted that FIG. 7 is a block diagram showing an exemplary configuration of the loudspeaker device 1 in the case where the non-linear component removal filter 10 refers to the output signal of the sensor 17. At this time, since the signal which is referred to by the non-linear component removal filter 10 is the vibration displacement x(t), the sensor 17 may be a sensor which detects the vibration displacement characteristic of the loudspeaker 16. Also, even if the signal detected by the sensor 17 is the velocity characteristic or the acceleration characteristic, the vibration displacement characteristic can be obtained by appropriately using a differentiating circuit and an integrating circuit.

Second Embodiment

Figure 8:
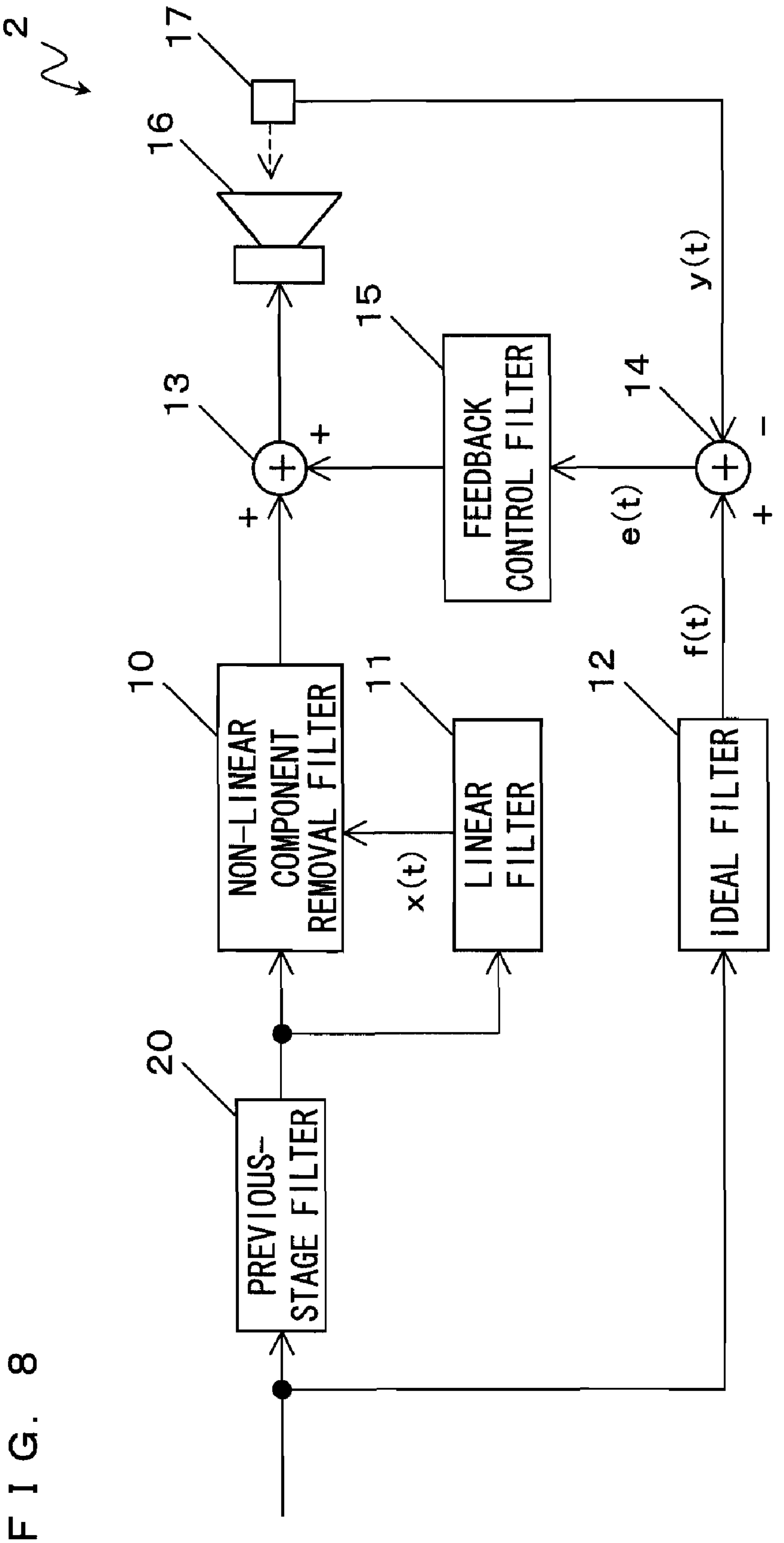
FIG. 8 is a block diagram showing an exemplary configuration of a loudspeaker device 2 according to a second embodiment.

With reference to FIG. 8, a loudspeaker device 2 according to a second embodiment of the present invention will be described. FIG. 8 is a block diagram showing an exemplary configuration of the loudspeaker device 2 according to the second embodiment. In FIG. 8, the loudspeaker device 2 comprises a non-linear component removal filter 10, a linear filter 11, an ideal filter 12, an adder 13, an adder 14, a feedback control filter 15, a loudspeaker 16, a sensor 17, and a previous-stage filter 20. As shown in FIG. 8, the loudspeaker device 2 according to the present embodiment differs from the above loudspeaker device 1 shown in FIG. 1 in newly having the previous-stage filter 20. The following will describe mainly the difference. Since the non-linear component removal filter 10, the linear filter 11, the ideal filter 12, the adder 13, the adder 14, the feedback control filter 15, the loudspeaker 16, and the sensor 17 are the same as those described in the first embodiment, the same numerals are used and the description thereof will be omitted.

The previous-stage filter 20 is located in a position immediately before the non-linear component removal filter 10 and the linear filter 11, and processes an electric signal as an input signal based on a predetermined filter coefficient. The signal processed by the previous-stage filter 20 is inputted to the non-linear component removal filter 10 and the linear filter 11. Here, the filter coefficient of the previous-stage filter 20 is F(s)/P(s) into which the transfer function F(s) of the desired output characteristic, which is the filter coefficient of the ideal filter 12, is divided by a transfer function P(s) of the output characteristic of the actual loudspeaker 16 in a linear operation. It is noted that the output characteristic of the transfer function P(s) is of the same kind as that of the desired output characteristic of the ideal filter 12. In other words, as described in the first embodiment, for example, when the transfer function F(s) is based on the vibration displacement characteristic of the loudspeaker 16, the transfer function P(s) is a function based on the vibration displacement characteristic in the linear operation of the loudspeaker 16.

Here, a transfer function of the input signal voltage inputted to the previous-stage filter 20 is denoted by E(s). At this time, the output signal of the previous-stage filter 20 becomes E(s)*F(s)/P(s). When the output signal is outputted by the loudspeaker 16 through the non-linear component removal filter 10, the output signal is multiplied by the transfer function P(s) of the loudspeaker 16, so that the output characteristic of the loudspeaker 16 finally becomes E(s)*F(s). In other words, the output characteristic of the loudspeaker 16 converts to a target characteristic F(s). At this time, the transfer function of the detection signal y(t) outputted by the sensor 17 becomes E(s)*F(s). Also, an input signal which becomes a transfer function E(s) is inputted to the ideal filter 12. At this time, since the filter coefficient of the ideal filter 12 is F(s), the transfer function of an output signal f(t) of the ideal filter 12 becomes E(s)*F(s). In the adder 14, the above detection signal y(t) is subtracted from the output signal f(t) from the ideal filter 12. At this time, the transfer functions of the output signal f(t) and the detection signal y(t) each are E(s)*F(s) and the same, and the error signal e(t) becomes zero.

For example, it is assumed that the transfer function of the loudspeaker changes from P(s) to P'(s) due to the secular change of the stiffness K of the support system, and the like. At this time, a transfer function Y(s)/E(s) of the loudspeaker device 2 shown in FIG. 8 becomes equation (15). It is noted that Y(s) is obtained by performing Laplace transform on an output signal y(t) from the loudspeaker 16. E(s) is obtained by performing Laplace transform on the input signal voltage.

$$Y(s)/E(s)=(P'(s)*[1+P(s)])/(P(s)*[1+P'(s)])*F(s) \qquad (15)$$

From the above equation (15), the right side of the equation (15) becomes F(s) when the transfer function P(s) of the loudspeaker 16 does not change (when P'(s)=P(s)). In other words, the output characteristic of the loudspeaker 16 converges to the desired characteristic F(s).

Next, in the loudspeaker device 1 shown in FIG. 1 which does not have the previous-stage filter 20, where a transfer function is P(s) in the linear operation of the loudspeaker 16, a transfer function Y(s)/E(s) of the loudspeaker device 1 shown in FIG. 1 becomes equation (16).

$$Y(s)/E(s)=(P(s)*[1+F(s)])/[1+P(s)] \qquad (16)$$

From the above equation (16), the right side of the equation (16) does not become F(s) when the transfer function P(s) of the loudspeaker 16 does not change (when P'(s)=P(s)). In other words, the output characteristic of the loudspeaker 16 does not converge to the desired characteristic F(s).

If the transfer function of the loudspeaker 16 changes from P(s) to P'(s), the transfer function Y(s)/E(s) of the loudspeaker device 1 shown in FIG. 1 becomes equation (17).

$$Y(s)/E(s)=(P'(s)*[1+F(s)])/[1+P'(s)] \quad (17)$$

Thus, in the loudspeaker device 1 shown in FIG. 1, as shown by the equation (16) and the equation (17), the output characteristic of the loudspeaker 16 becomes a characteristic approximated to F(s) by providing the ideal filter 12, but does not converge to the desired characteristic F(s) regardless of the change of the transfer function of the loudspeaker 16. On the other hand, in the loudspeaker device 2 shown in FIG. 8, by providing the previous-stage filter 20, the output characteristic of the loudspeaker 16 converges to F(s) at least when the transfer function of the loudspeaker does not change. In other words, the previous-stage filter 20 plays a role to enhance convergence of the output characteristic of the loudspeaker 16 to the desired output characteristic.

As described above, the loudspeaker device 2 according to the present embodiment can enhance the convergence to the desired output characteristic (the transfer function F(s)) by providing the previous-stage filter 20.

It is noted that similarly as in the first embodiment, the above feedback control filter 15 may have a characteristic of, for example, a low-pass filter in addition to gain adjustment. In the loudspeaker device 2 shown in FIG. 8, if there is no fear of the oscillation by the error signal e(t) and the gain adjustment is not needed, the feedback control filter 15 may be omitted.

In the above non-linear component removal filter 10, similarly as in the first embodiment, the non-linear distortion attributable to the force coefficient Bl and the stiffness K of the support system is removed by using the filter coefficient shown by the equation (13) derived from the equation (8) but it is not limited thereto. In the equation (8), further, the above electrical impedance characteristic Ze of the voice coil 161 is reflected as the function Ze(x) of the vibration displacement x, and the filter coefficient which takes the electrical impedance characteristic Ze into consideration may be set from the equation (14).

Figure 9:
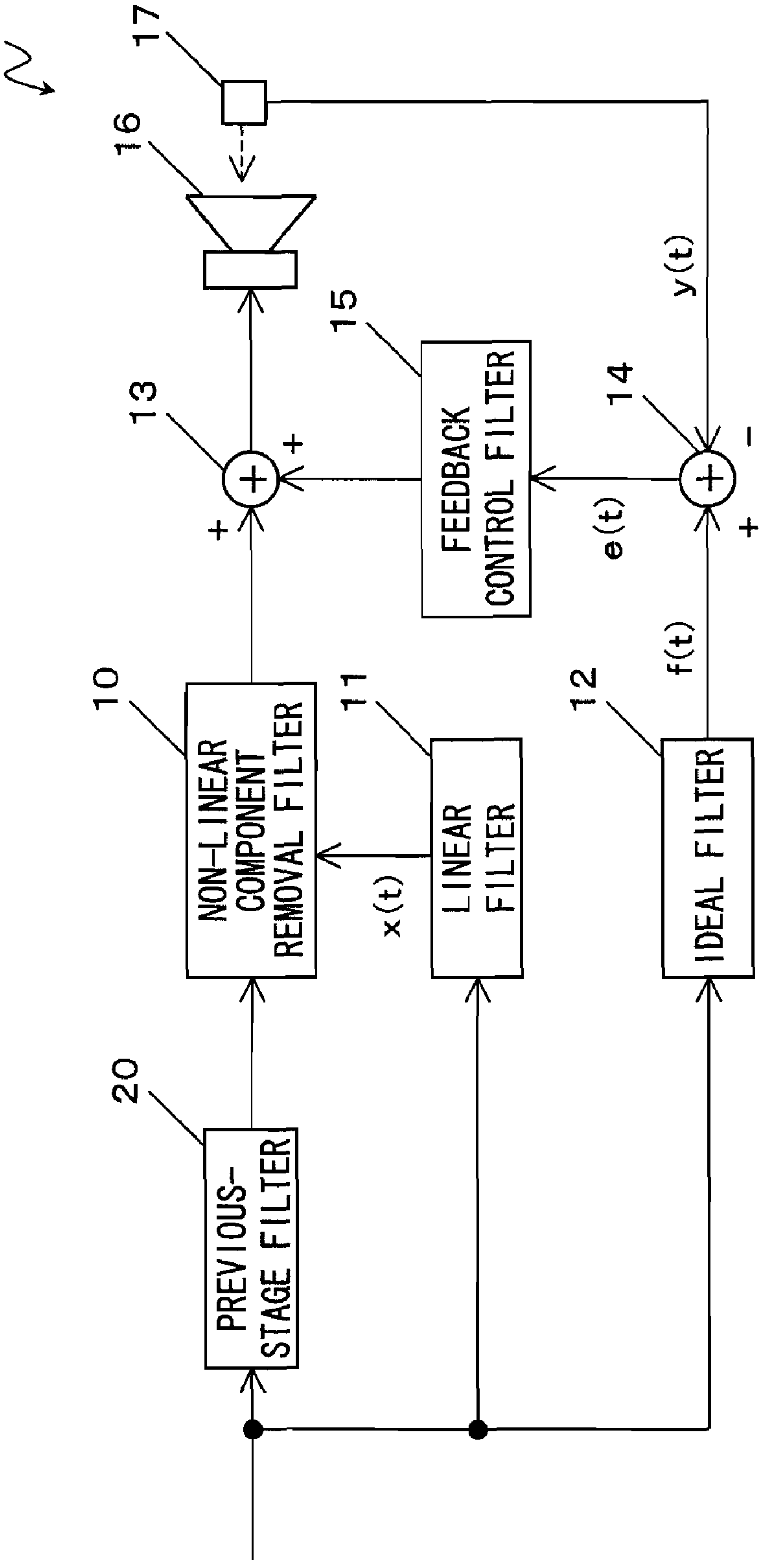
FIG. 9 is a block diagram showing an exemplary configuration in which an input of a linear filter 11 shown in FIG. 8 is changed.

FIG. 8 shows a configuration in which the input of the linear filter 11 is connected to the output of the previous-stage filter 20, but it is not limited thereto. Even if a configuration is provided in which the input of the linear filter 11 is the same as those of the previous-stage filter 20 and the ideal filter 12 as shown in FIG. 9, the same effects as those obtained by the configuration shown in FIG. 8 can be obtained. It is noted that FIG. 9 is a block diagram showing an exemplary configuration in which the input of the linear filter 11 shown in FIG. 8 is changed.

Figure 10:
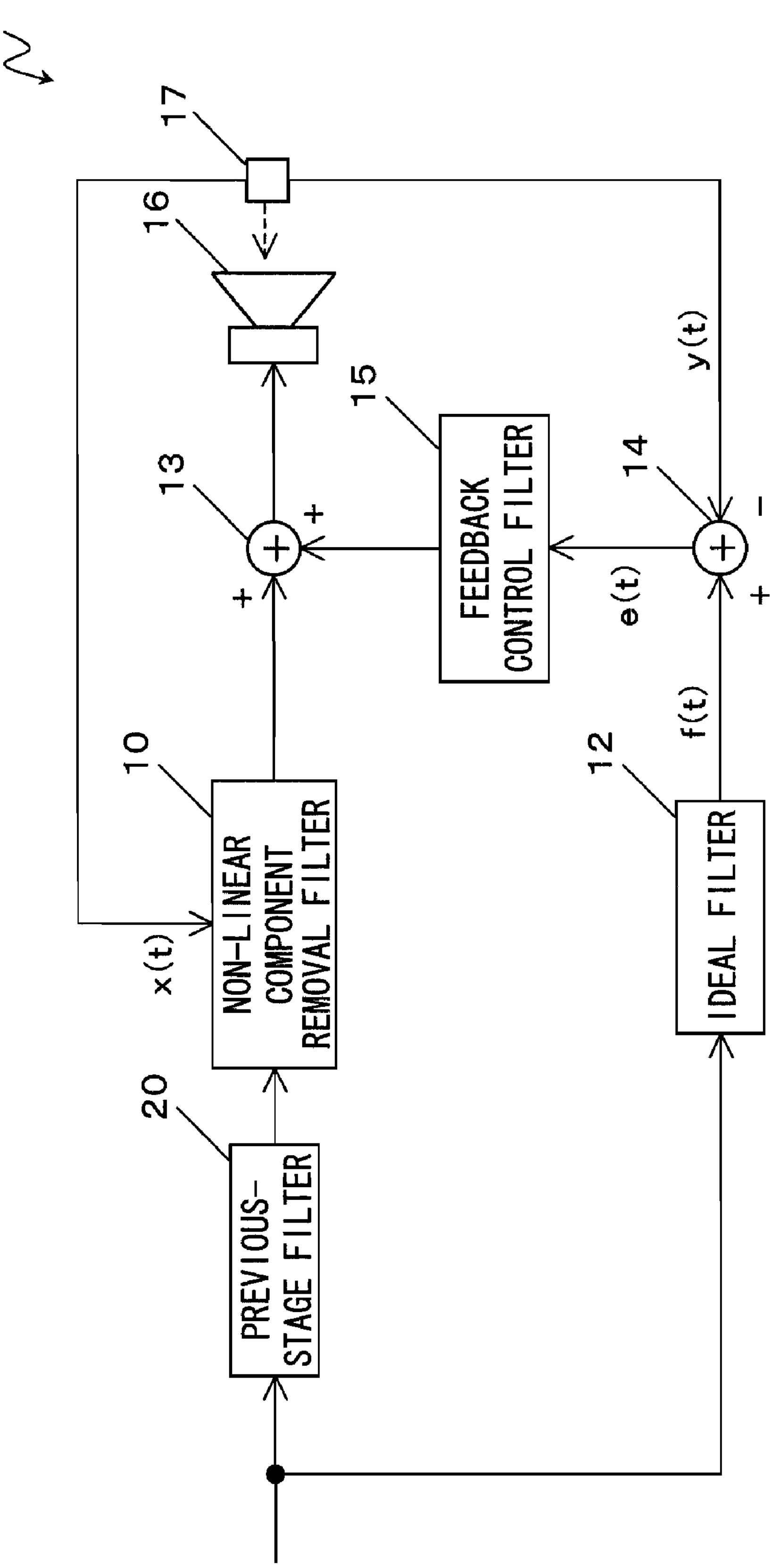
FIG. 10 is a block diagram showing an exemplary configuration of the loudspeaker device 2 when a non-linear component removal filter 10 refers to an output signal of a sensor 17.

Similarly as in the first embodiment, the above non-linear component removal filter 10 refers to the vibration displacement x(t) in the pseudo linear operation produced by the linear filter 11 but may refer directly to the output signal of the sensor 17 as shown in FIG. 10. In other words, the linear filter 11 can be omitted by referring directly to the output of the sensor 17. It is noted that FIG. 10 is a block diagram showing an exemplary configuration of the loudspeaker device 2 in the case where the non-linear component removal filter 10 refers to the output signal of the sensor 17. At this time, since the signal which is referred to by the non-linear component removal filter 10 is the vibration displacement x(t), the sensor 17 may be a sensor which detects the vibration displacement characteristic of the loudspeaker 16. Also, even if the signal detected by the sensor is the velocity characteristic or the acceleration characteristic, the vibration displacement characteristic can be obtained by appropriately using a differentiating circuit and an integrating circuit.

Third Embodiment

Figure 11:
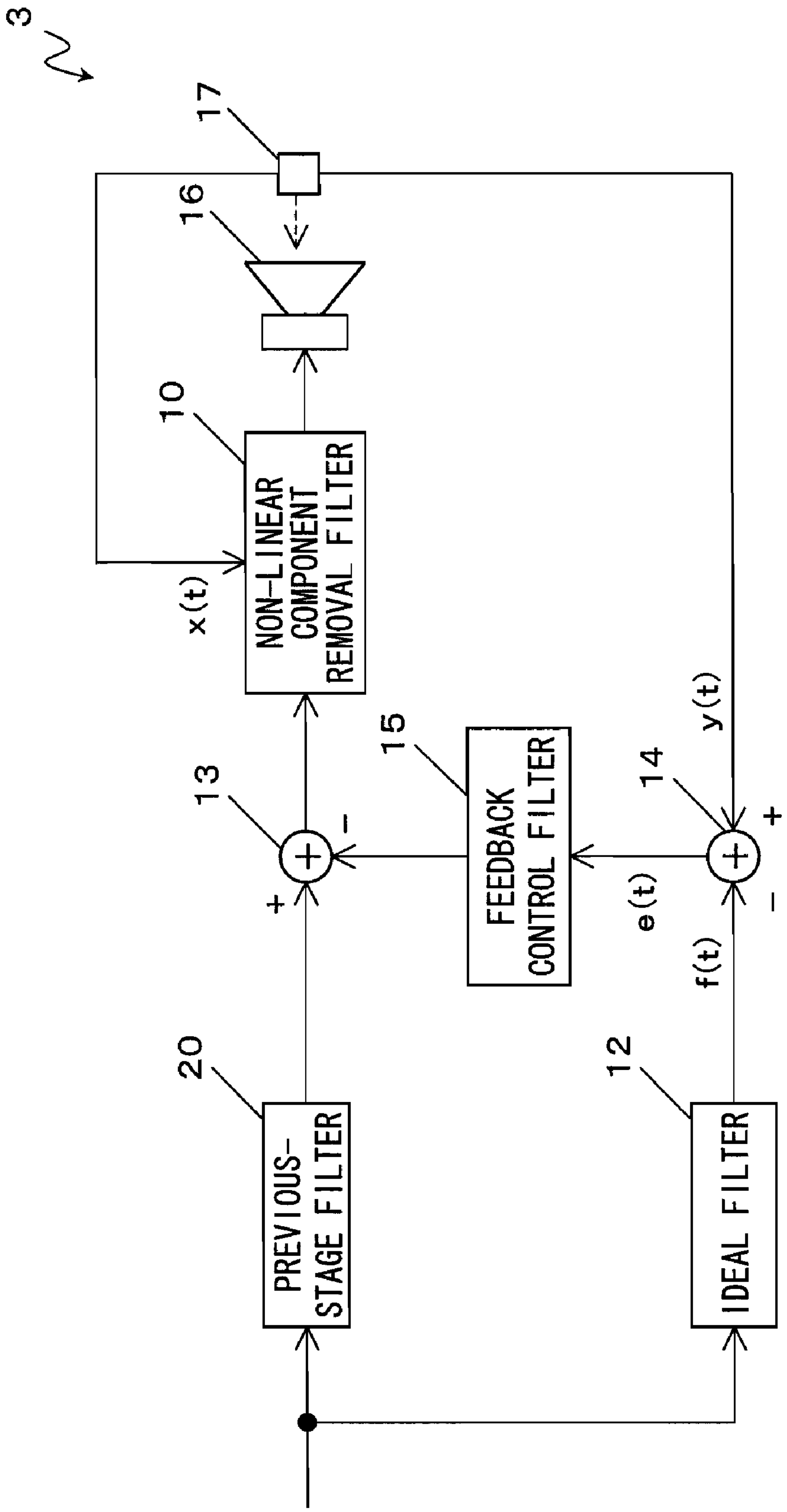
FIG. 11 is a block diagram showing an exemplary configuration of a loudspeaker device 3 according to a third embodiment.

With reference to FIG. 11, a loudspeaker device 3 according to a third embodiment of the present invention will be described. FIG. 11 is a block diagram showing an exemplary configuration of the loudspeaker device 3 according to the third embodiment. In FIG. 11, the loudspeaker device 3 comprises a non-linear component removal filter 10, an ideal filter 12, an adder 13, an adder 14, a feedback control filter 15, a loudspeaker 16, a sensor 17, and a previous-stage filter 20. The loudspeaker device 3 according to the present embodiment differs from the loudspeaker devices 1 and 2 shown in FIGS. 1, and 7 to 10 in that the non-linear component removal filter 10 is located between the adder 13 and the loudspeaker 16, and by the difference, the loudspeaker device can widen to a low-frequency band the frequency band in which the effect of distortion removal is obtained.

The following will describe mainly the above difference with reference to FIG. 11. In FIG. 11, as the loudspeaker device 3, an exemplary configuration is shown in which the location of the non-linear component removal filter 10 with respect to the loudspeaker device 2 is changed. It is noted that in FIG. 11, the symbols concerning the inputs and the outputs of the adders 13 and 14 are different from those shown in FIG. 10. However, if they are assigned so that a phase relation is the same, the same operation and the same effect are provided even though each symbol is any of them. Since the non-linear component removal filter 10, the ideal filter 12, the adder 13, the adder 14, the feedback control filter 15, the loudspeaker 16, and the sensor 17 are the same as those described in the first and second embodiments, the same numerals are used and the description thereof will be omitted.

The non-linear component removal filter 10 is located between the adder 13 and the loudspeaker 16. In other words, the non-linear component removal filter 10 is located in a feedback loop which is formed by the sensor 17, the adder 14, the feedback control filter 15, the adder 13, and the loudspeaker 16. In this case, a unit of the non-linear component removal filter 10 and the loudspeaker 16 can be considered as a controlled object in linear two-degree-of-freedom control.

Here, as described in the first embodiment, the non-linear component removal filter 10 cancels the non-linear component of the modeled stiffness K, and plays a role to remove the non-linear distortion which occurs from the loudspeaker 16. Thus, the above controlled object can be considered as an object in which the non-linear distortion of the loudspeaker 16 is removed to some extent by the non-linear component removal filter 10. By locating such a controlled object in the feedback loop, the change of the stiffness K with respect to the vibration displacement x shown in FIG. 4 becomes small in the feedback loop. In other words, it means that the stiffness K does not change substantially even when the amplitude of the loudspeaker 16 becomes large. Also, since the change of the stiffness K becomes small, change of the lowest resonance frequency f0 becomes small.

On the other hand, in the loudspeaker device 2 shown in FIG. 10, the non-linear component removal filter 10 is not located in the feedback loop. Thus, in the loudspeaker device 2 shown in FIG. 10, the above controlled object is the loudspeaker 16, and is not an object in which the non-linear distortion is removed to some extent in the feedback loop as described above.

As described above, in the case where the processing in the feedback loop is focused on, in the loudspeaker device 3 according to the present embodiment, the change of the lowest resonance frequency f0 of the loudspeaker 16 becomes small compared to that in the loudspeaker device 2 shown in FIG. 10.

Figure 12:
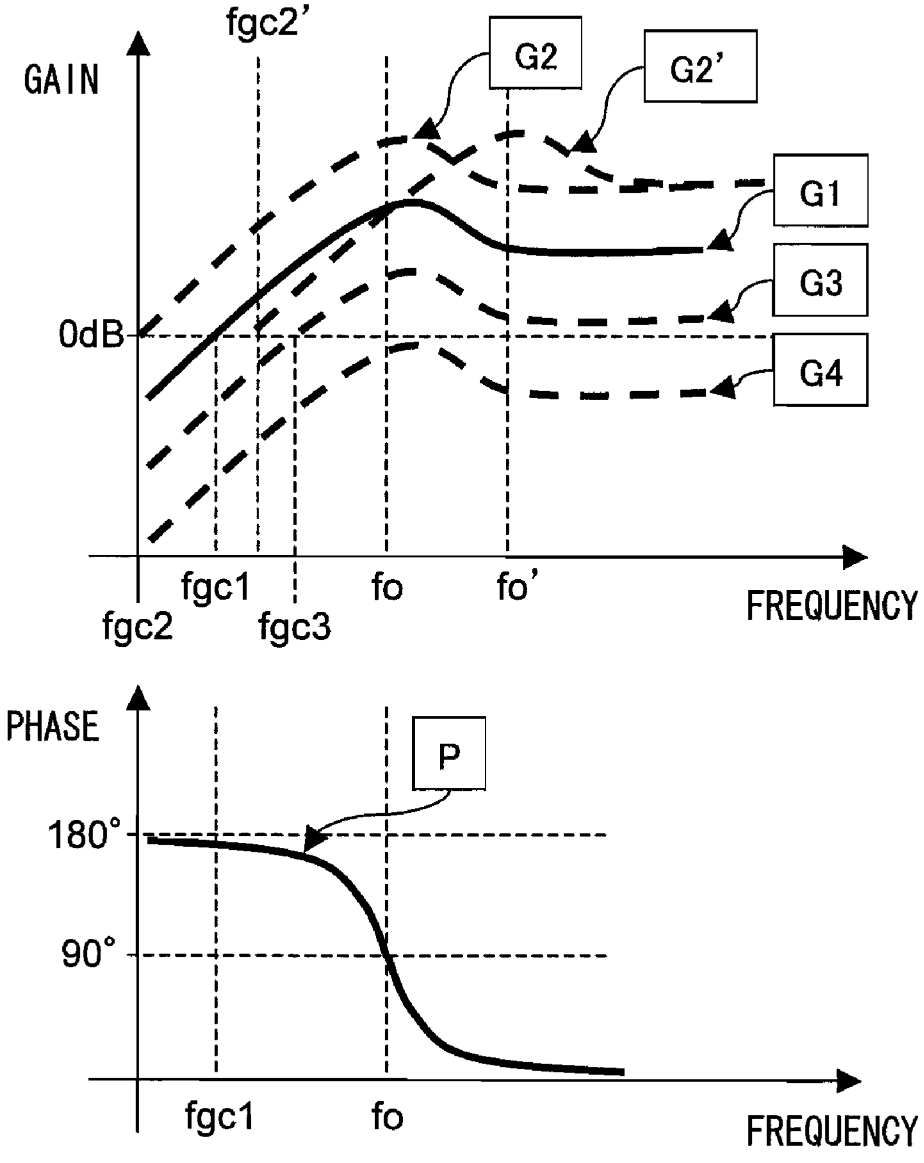
FIG. 12 shows a gain characteristic and a phase characteristic of the loudspeaker device 3.

The following will describe more specifically the above contents by referring to gain characteristics G1 to G4 and a phase characteristic P of the loudspeaker device 3 which are shown in FIG. 12. FIG. 12 shows the gain characteristics and the phase characteristic of the loudspeaker device 3. It is noted that the gain characteristics G1 to G4 shown in FIG. 12 are open-loop transfer characteristics. The gain characteristic G1 shown by the solid line in FIG. 12 shows the sound pressure frequency characteristic of the loudspeaker 16, namely, a characteristic proportional to an acceleration characteristic. The gain characteristics G2 to G4 shown by the dotted lines will be described later.

According to the gain characteristic G1, it is seen that the gain is attenuated at a gradient of −12 dB/oct in the frequency band which is the lowest resonance frequency f0 or less. According to the phase characteristic P shown in FIG. 12, it is seen that the phase is shifted 90° at the lowest resonance frequency f0. In the lowest resonance frequency f0 or less, it is seen that the phase shift approaches 180° as the frequency is small. In the lowest resonance frequency f0 or greater, it is seen that the phase shift approaches 0° as the frequency is large.

Here, in the feedback control filter 15 shown in FIG. 11, the case where the gain of the error signal e(t) inputted to the adder 13 is adjusted is considered. In this case, the gain characteristic G1 is changed to the gain characteristic G2, G3, or G4 shown by the dotted line in FIG. 12 depending on the magnitude of the gain adjusted by the feedback control filter 15. It is noted that the magnitude of the input to the loudspeaker 16 changes depending on the magnitude of the gain adjusted by the feedback control filter 15. By the change of the magnitude of the input to the loudspeaker, the magnitude of the amplitude of the loudspeaker 16 changes. Here, as described above, in the loudspeaker device 3, the change of the lowest resonance frequency f0 is small even when the amplitude of the loudspeaker 16 becomes large. Thus, each of the lowest resonance frequencies of the gain characteristics G2, G3, and G4 shown by the dotted lines in FIG. 12 is a value close to F0.

Next, evaluated values which are gain margin and phase margin are considered. The gain margin indicates how much of a minus value the gain of the open-loop transfer characteristic becomes when the phase of the open-loop characteristic is 180°. It is noted that the frequency at a phase of 180° is referred to as a phase crossover frequency fpc. The phase margin indicates how much of a minus value with respect to 180° the phase of the open-loop transfer characteristic becomes when the gain of the open-loop transfer characteristic is 0 dB. It is noted that the frequency at a gain of 0 dB is referred to as a gain crossover frequency fgc.

Figure 13:
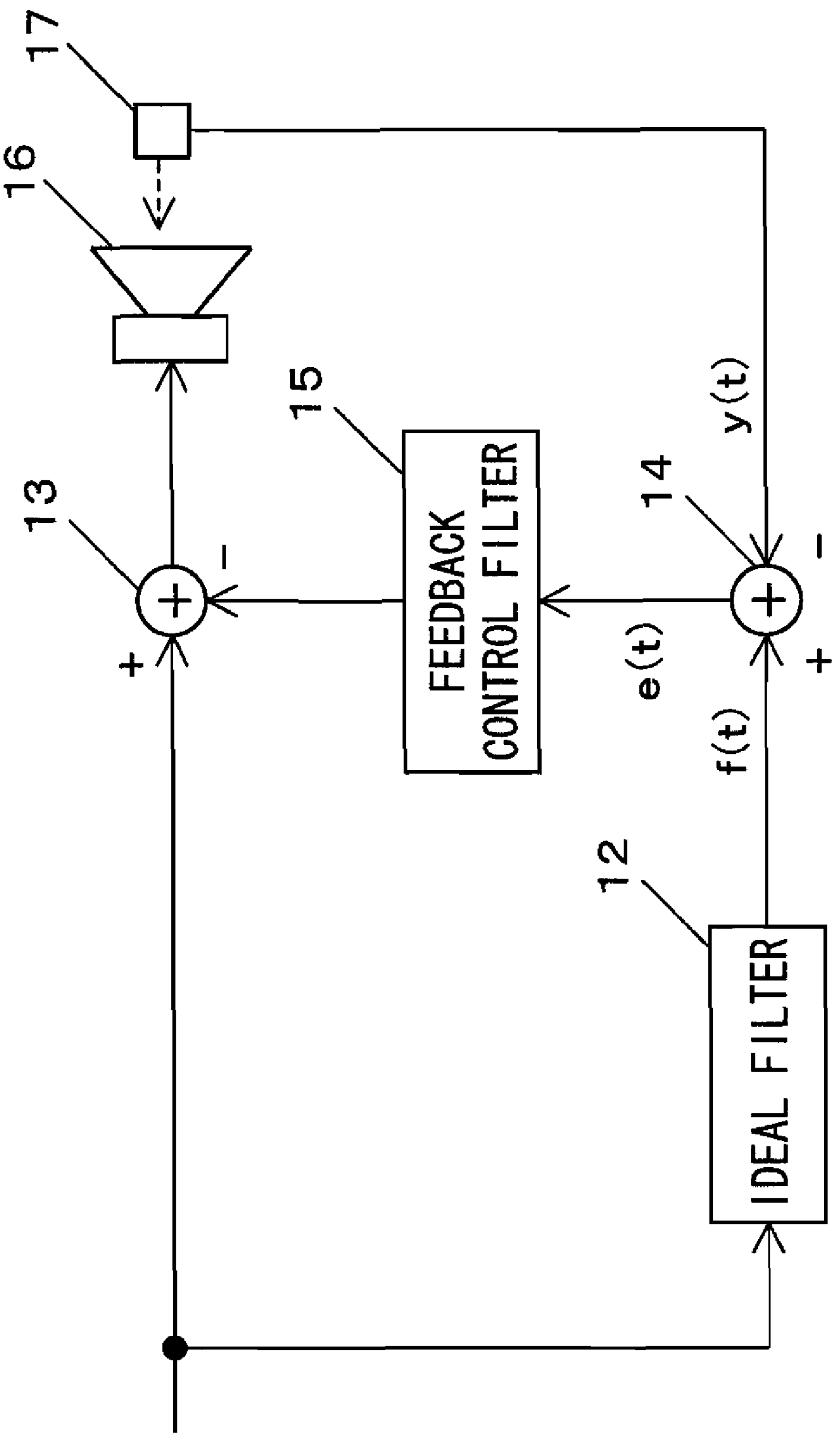
FIG. 13 illustrates a configuration used for analysis of a frequency characteristic of the loudspeaker device 2 shown in FIG. 10.

Here, the frequency characteristic of the feedback loop of the loudspeaker device 2 shown in FIG. 10 is analyzed. In the feedback loop of the loudspeaker device 2 shown in FIG. 10, since a signal indicating a normal acceleration characteristic is fed back, the frequency characteristic changes substantially, and thus analysis becomes difficult to perform. The ideal filter 12 is added as shown in FIG. 13, and the analysis of the frequency characteristic is considered. In other words, the ideal filter 12 is added, and analysis is performed in a state where the frequency characteristic does not change. FIG. 13 illustrates a configuration used for the analysis of the frequency characteristic of the loudspeaker device 2 shown in FIG. 10.

Figure 14:
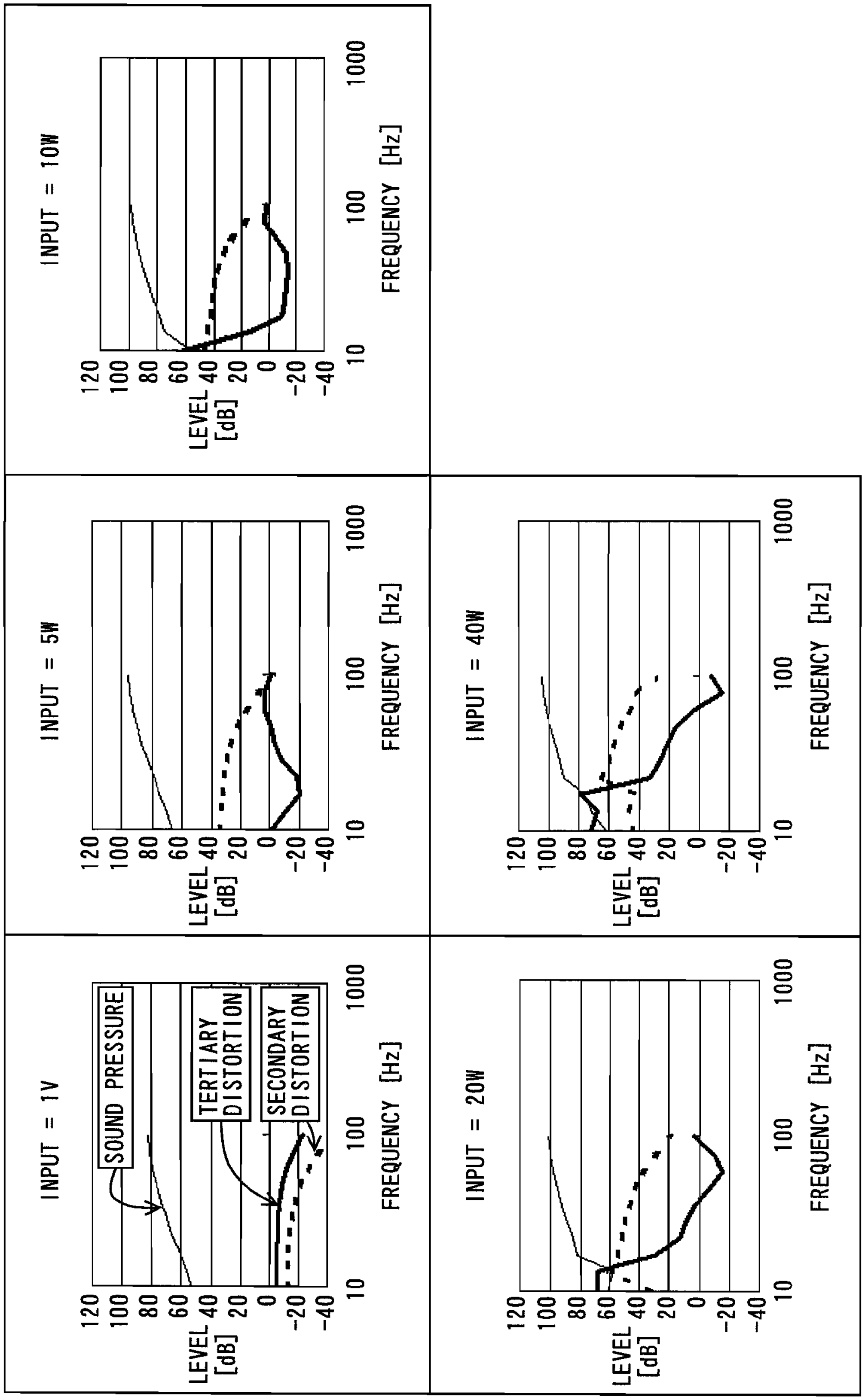
FIG. 14 shows gain characteristics. secondary distortion characteristics, and tertiary distortion characteristics when an input to a loudspeaker 16 of FIG. 13 is changed.

FIG. 14 shows the sound pressure frequency characteristic, the secondary distortion characteristic, and the tertiary distortion characteristic when the magnitude of the input to the loudspeaker 16 of FIG. 13 is changed. More specifically, as shown in FIG. 14, the sound pressure frequency characteristics, the secondary distortion characteristics, and the tertiary distortion characteristics when the input to the loudspeaker 16 is 1V, 5 W, 10 W, 20 W, and 40 W are shown. As seen from FIG. 14, as the input becomes large, the levels of the secondary and tertiary distortions become large. This is because the stiffness rises as the input becomes large, so that the gain crossover frequency fgc rises. Thus, the frequency of the lower limit of the frequency band in which the effect of distortion removal is obtained is proportional to the gain crossover frequency fgc.

With reference to FIG. 12 again, the following will describe the reason why the loudspeaker device 3 can widen to the low-frequency band the frequency band in which the effect of distortion removal is obtained. In FIG. 12, when the feedback control filter 15 performs adjustment to raise the gain, the gain characteristic G1 becomes a characteristic shown by the gain characteristic G2. At this time, a gain crossover frequency fgc2 in the gain characteristic G2 becomes a frequency which is lower than a gain crossover frequency fgc1. This is because as described above, in the loudspeaker device 3, the change of the lowest resonance frequency f0 is small even when the magnitude of the amplitude of the loudspeaker 16 changes. Thus, the loudspeaker device 3 results in that the frequency band in which the effect of distortion removal is obtained is widened to the low-frequency band in proportion to the gain crossover frequency fgc2.

On the other hand, in the loudspeaker device 2 shown in FIG. 10, as described above, the non-linear component removal filter 10 is not located in the feedback loop. Thus, in the loudspeaker device 2 shown in FIG. 10, when the input to the loudspeaker 16 becomes large, namely, when the feedback control filter 15 performs adjustment to raise the gain, the gain characteristic G1 becomes a characteristic shown by a gain characteristic G2'. In other words, the value of the stiffness K becomes large, and the lowest resonance frequency f0 rises to F0'. In addition, the gain crossover frequency rises to a gain crossover frequency fgc2' with the rise of the lowest resonance frequency f0. Thus, the loudspeaker device 2 results in that the frequency band in which the effect of distortion removal is obtained is shifted to the high-frequency band in proportion to the gain crossover frequency fgc2'.

It is noted that in FIG. 12, when the feedback control filter 15 performs adjustment to lower the gain, the gain characteristic G1 becomes a characteristic shown by the gain characteristic G3. At this time, a gain crossover frequency fgc3 in the gain characteristic G3 becomes a frequency which is higher than the gain crossover frequency fgc1. In other words, when the feedback control filter 15 performs adjustment to lower the gain, the gain characteristic changes from the gain characteristic G1 to the gain characteristic G3, and the gain crossover frequency fgc1 rises to the gain crossover frequency fgc3. When the feedback control filter 15 performs adjustment to lower the gain further, the gain characteristic G1 becomes a characteristic shown by the gain characteristic G4. According to the gain characteristic G4, the value of the gain is minus throughout the entire frequency band. Thus, when the gain characteristic is G4, the feedback processing is stabilized completely. However, by the lowering of a feedback gain, the effect of reducing distortion becomes small. The fact that the effect of distortion reduction becomes small by these gain characteristics G3 and G4 is true on the loudspeaker device 2 shown in FIG. 10. In a control system using the loudspeaker 16, the phase does not become 180°, and the phase crossover frequency fpc does not exist. Much the same is true on the loudspeaker devices 1 to 3. Since the phase does not become 180°, the value of above phase margin is always minus.

As described above, according to the loudspeaker device 3 shown in FIG. 11, by locating the non-linear component removal filter 10 in the feedback loop, the change of the lowest resonance frequency f0 of the loudspeaker 16 becomes small compared to that in the loudspeaker device 2 shown in FIG. 10. By the change of the lowest resonance frequency f0 of the loudspeaker 16 becoming small, the change of the gain crossover frequency fgc becomes small. Thus, even though the input becomes large, the loudspeaker device 3 shown in FIG. 11 can achieve the effect of distortion removal to a frequency band which is lower than that in the loudspeaker device 2 shown in FIG. 10.

Figure 15:
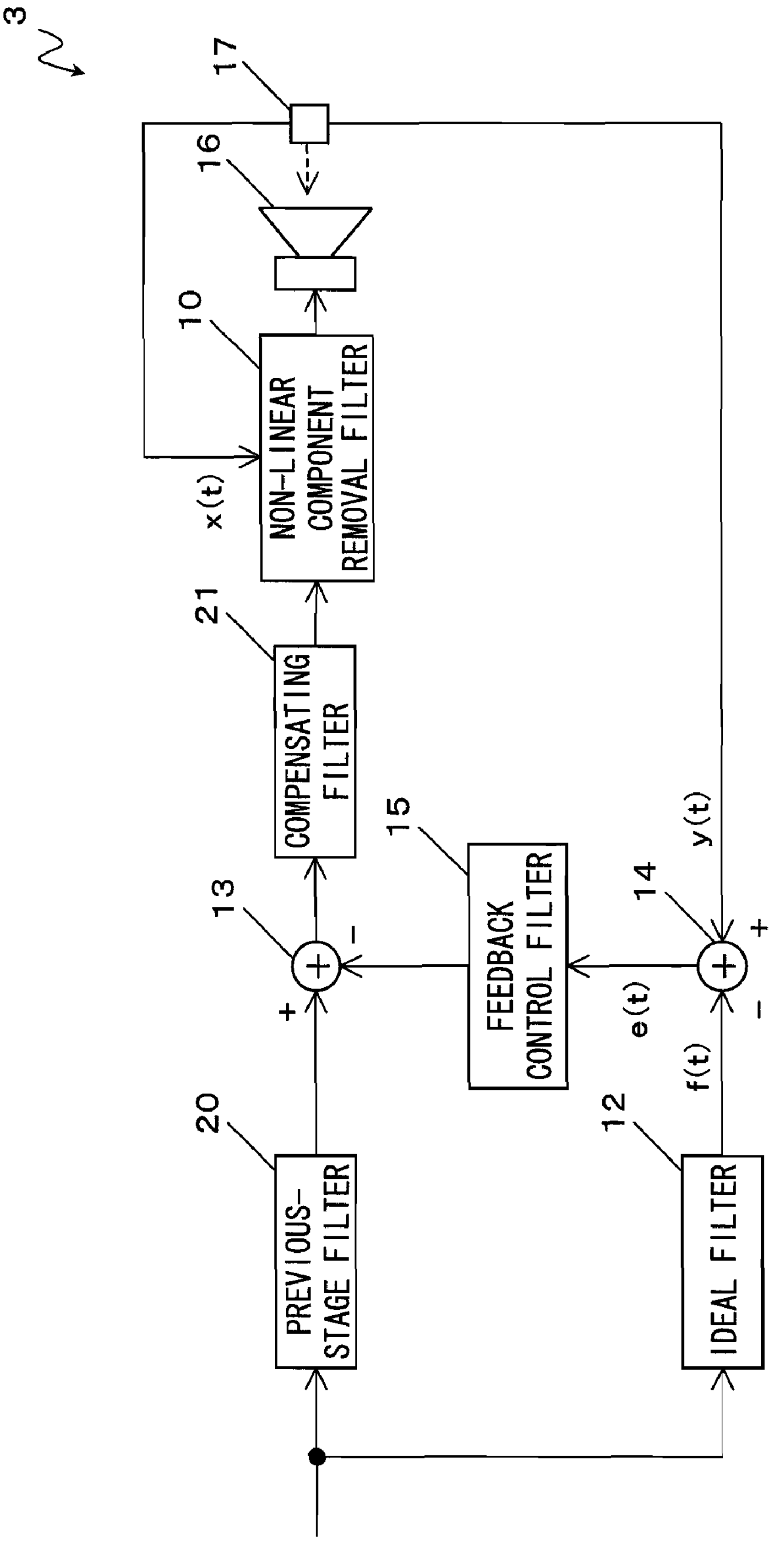
FIG. 15 is a block diagram showing an exemplary configuration in which a compensating filter 21 is added to the loudspeaker device 3 shown in FIG. 11.

It is noted that with respect to the loudspeaker device 3 shown in FIG. 11, as shown in FIG. 15, a compensating filter 21 may be added in a position immediately before the non-linear removal filter 10. FIG. 15 is a block diagram showing an exemplary configuration in which the compensating filter 21 is added to the loudspeaker device 3 shown in FIG. 11.

The compensating filter 21 increases the level in the low-frequency band in the open-loop transfer characteristic of the loudspeaker device 3. In other words, the compensating filter 21 corresponds to a low-pass filter of the present invention. More specifically, the compensating filter 21 has a filter coefficient H indicated by a transfer function such as equation (18).

$$H=k*(1+1/(T*s)) \quad (18)$$

It is noted that T=1/(2*π*fmax).

Figure 16:
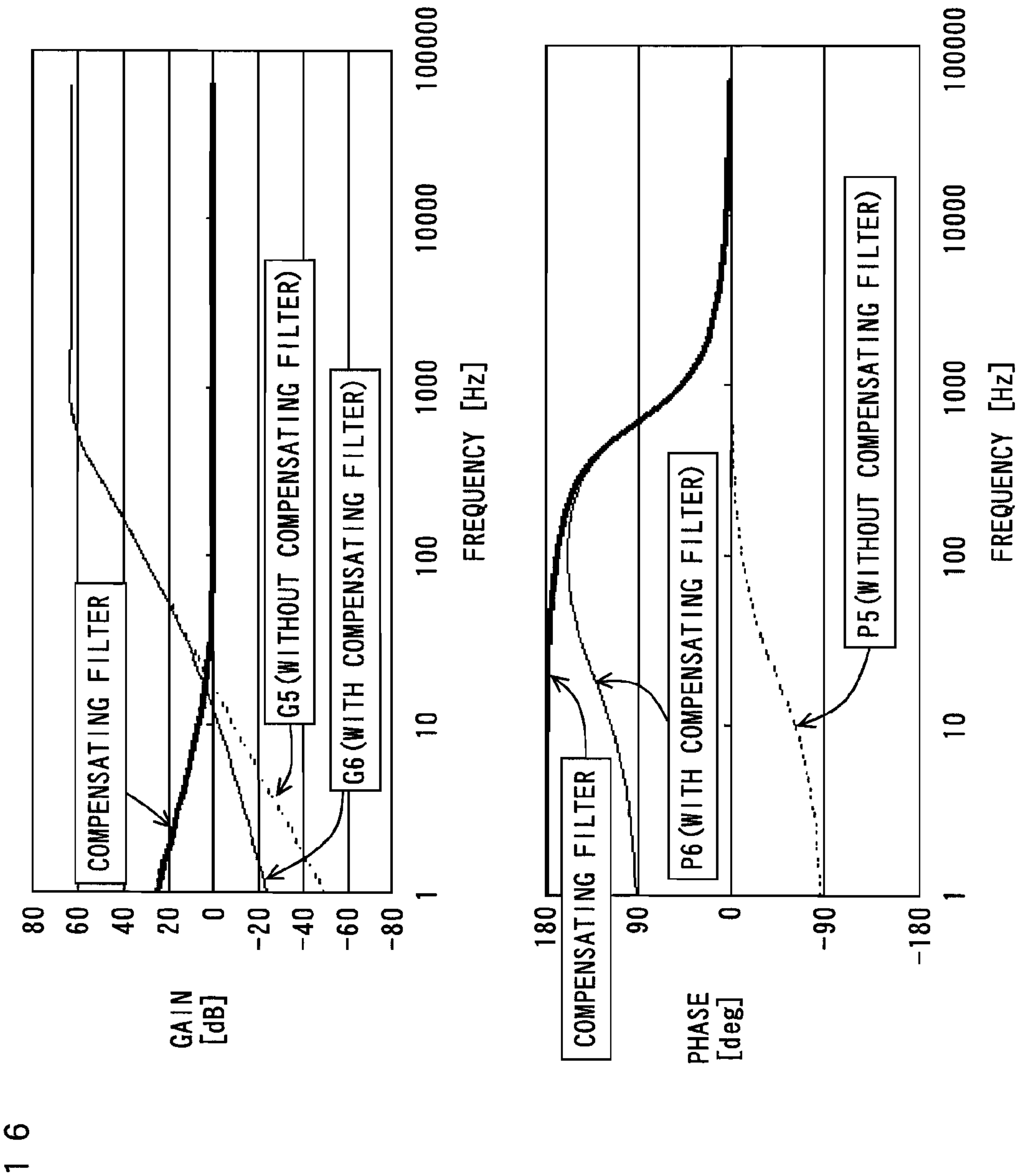
FIG. 16 shows a frequency characteristic of a transfer function shown by equation (18).

Here, k denotes a gain, and fmax denotes an inflection frequency of the frequency characteristic. The inflection frequency means a frequency when the gradient of the frequency characteristic changes. For example, it is assumed that the inflection frequency is a frequency at a point where the gain changes from 0 dB to 3 dB. The frequency characteristic of the transfer function shown by the equation (18) becomes a characteristic shown in FIG. 16. FIG. 16 shows the gain characteristic and the phase characteristic of the compensating filter and the gain characteristic (G5 and G6) and the phase characteristic (P5 and P6) of the loudspeaker device 3. According to the gain characteristic of the loudspeaker device 3 which is shown in FIG. 16, the gain characteristic G5 of the dotted line shown in FIG. 16 changes to the gain characteristic G6 shown by the solid line by the filter characteristic of the compensating filter 21. Since the level in the low-frequency band rises in the state where the phase crossover frequency fpc does not exist, the gain crossover frequency fgc can be approximated to DC. Thus, since the frequency in which the above effect of distortion removal is obtained is lowered, the effect of distortion removal is prevented from being deteriorated when the input is large, and the effect of distortion removal can be achieved to a lower-frequency band.

The above inflection frequency fmax is set to a frequency which is higher than at least the gain crossover frequency fgc. Although the degree of the equation (18) is one, it is not limited thereto. It may be a transfer function of the first degree or greater as long as the gain crossover frequency fgc can be lowered. If the degree of the equation (18) becomes high, the gradient at which the gain rises in the inflection frequency or less is steep in the filter characteristic of the compensating filter 21. Thus, the gain characteristic of the loudspeaker device 3 can lower the gain crossover frequency fgc as the degree of the equation (18) becomes high. However, concerning which the degree is to be, designing may be appropriately performed in view of the phase characteristic. It is noted that when the filter coefficient of the compensating filter 21 is of the first degree, the filter characteristic of the compensating filter 21 shows a characteristic which is inclined at a gradient of −6 dB/oct in a frequency band which is equal to or lower than the above inflection frequency.

Figure 17:
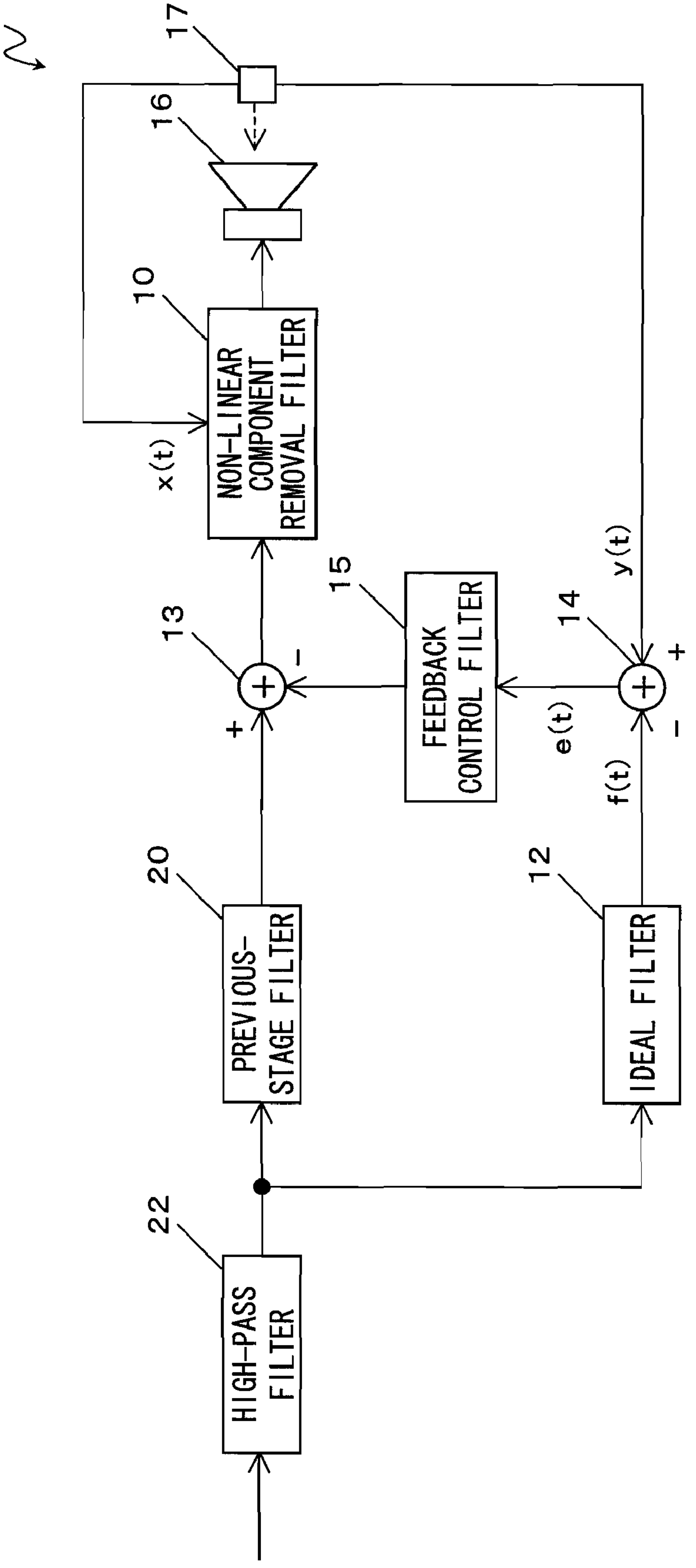
FIG. 17 is a block diagram showing an exemplary configuration in which a high-pass filter 22 is added to the loudspeaker device 3 shown in FIG. 11.

It is noted that with respect to the loudspeaker device 3 shown in FIG. 11, a high-pass filter 22 may be further added as shown in FIG. 17. FIG. 17 is a block diagram showing an exemplary configuration in which the high-pass filter 22 is added to the loudspeaker device 3 shown in FIG. 11.

The high-pass filter 22 prevents a signal, the frequency of which is equal to or lower than the gain crossover frequency fgc, from being inputted in advance. Thus, at least a cut-off frequency needs to be equal to or higher than the gain crossover frequency fgc. Since a cut-off characteristic is excellent as the degree becomes high, the degree may be selected for convenience of designing. When the filter coefficient of the high-pass filter 22 is of the first degree, the filter characteristic of the high-pass filter 22 shows a characteristic which is inclined at a gradient of +6 dB/oct in a frequency band which is equal to or lower than the above cut-off frequency. It is noted that the high-pass filter 22 may have a cut-off characteristic which is inclined at a gradient of +6 dB/oct or more. In this case, a signal the frequency of which is equal to or lower than the gain crossover frequency fgc is cut off further, and the effect of distortion reduction is not deteriorated.

Figure 18:
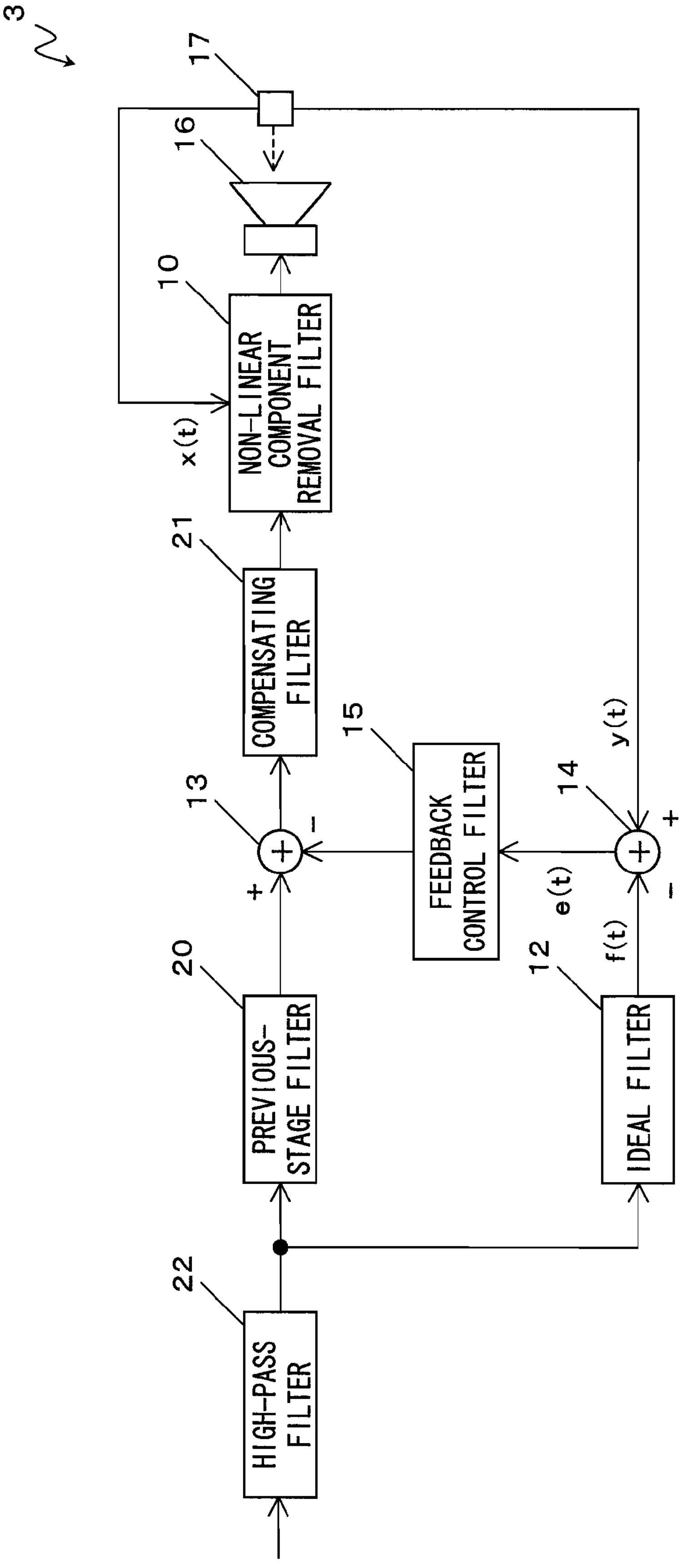
FIG. 18 is a block diagram showing an exemplary configuration in which the compensating filter 21 and the high-pass filter 22 are added to the loudspeaker device 3 shown in FIG. 11.

It is noted that with respect to the loudspeaker device 3 shown in FIG. 11, the compensating filter 21 and the high-pass filter 22 may be added as shown in FIG. 18. FIG. 18 is a block diagram showing an exemplary configuration in which the compensating filter 21 and the high-pass filter 22 are added to the loudspeaker device 3 shown in FIG. 11.

Figure 19:
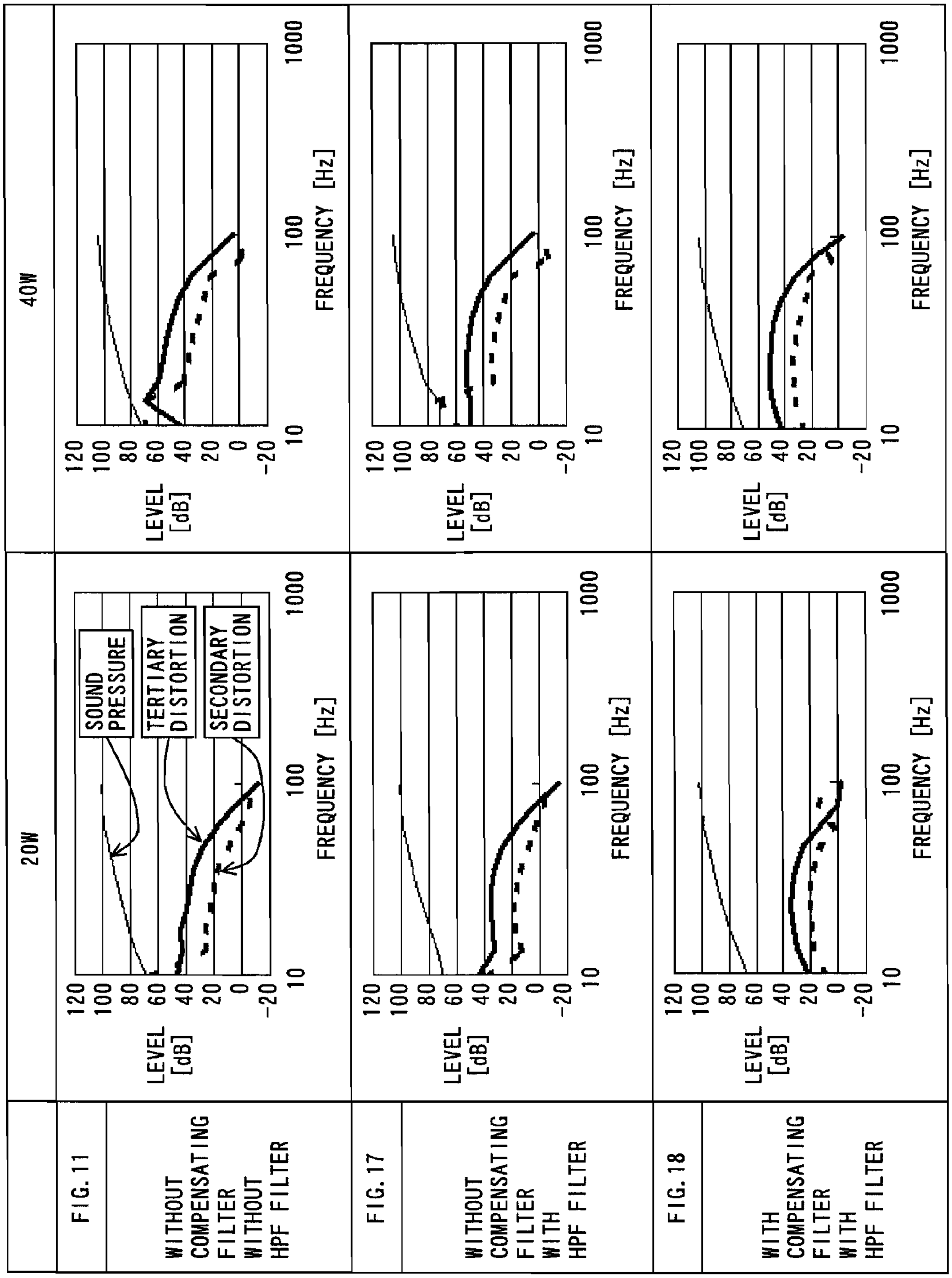
FIG. 19 shows analysis results when an input is 20 W and 40 W.

Here, an analysis result of the frequency characteristic concerning each of the loudspeaker device 3 in FIG. 11, the loudspeaker device 3 in FIG. 17 to which only the high-pass filter 22 is added, and the loudspeaker device 3 in FIG. 18 to which the high-pass filter 22 and the compensating filter 21 are added is shown in FIG. 19. FIG. 19 shows analysis results when the input is 20 W and 40 W.

It is seen that the secondary and tertiary distortions of the loudspeaker device 3 shown in FIG. 18 to which the high-pass filter 22 and the compensating filter 21 are added is the smallest among secondary and tertiary distortions shown in FIG. 19. In other words, as shown from the analysis results, the loudspeaker device 3 shown in FIG. 18 to which the high-pass filter 22 and the compensating filter 21 are added is a device which provides the highest effect of distortion removal.

It is noted that in the above description of FIG. 12, the phase crossover frequency fpc does not exist, and the phase margin is always minus. Here, when the above gain margin and phase margin are minus, the feedback processing is unstable, and oscillation occurs. Thus, in the case where the phase crossover frequency fpc does not exist and the phase margin is always a minus value, how the stability of the feedback processing will be is a problem. On the other hand, verification is performed by referring to a step response. It is noted that for simplification, analysis is performed with the feedback loop of the loudspeaker device 2 shown in FIG. 10.

Figure 20:
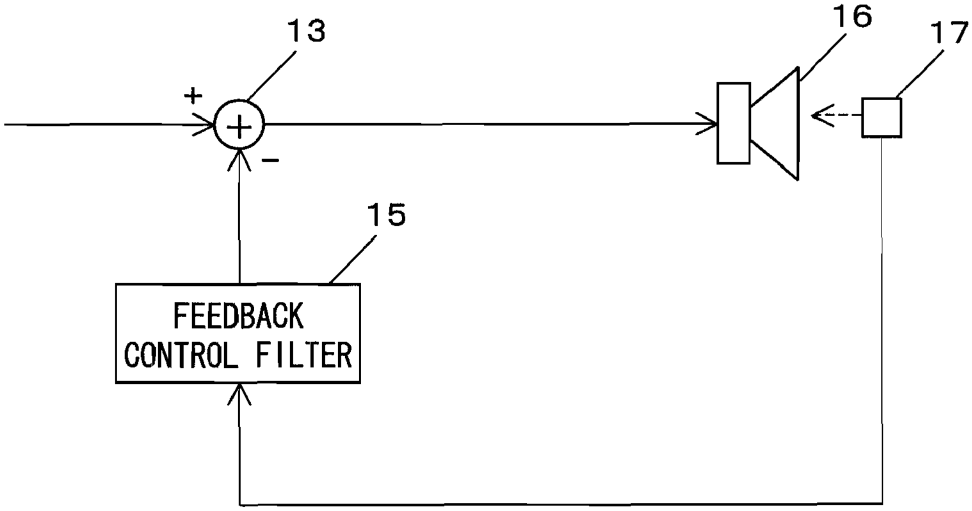
FIG. 20 illustrates a feedback loop of the loudspeaker device 2 shown in FIG. 10.

FIG. 20 illustrates the feedback loop of the loudspeaker device 2 shown in FIG. 10. Although the processing of the ideal filter 12 is a part of the feedback processing, if the processing of the ideal filter 12 is focused on, the processing of the ideal filter 12 is processing of outputting an inputted electric signal to the adder 14, and corresponds to the feed-forward processing. The ideal filter 12 is modeled on that in the actual loudspeaker 16 which is a secondary vibration system. Thus, the processing of the ideal filter 12 is constantly stable but does not affect the stability of the above feedback processing. Therefore, the processing of the ideal filter 12 may not be considered in evaluating the stability of the feedback processing.

Figure 21:
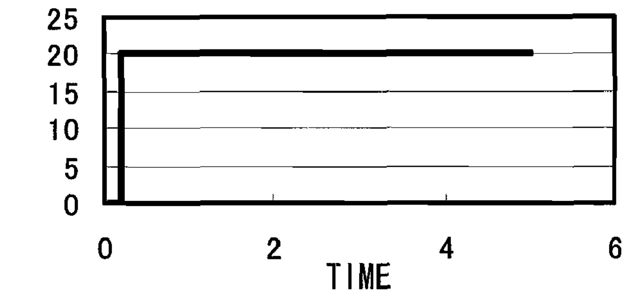
FIG. 21 shows a step input and its response in the feedback loop shown in FIG. 20.
Figure 21:
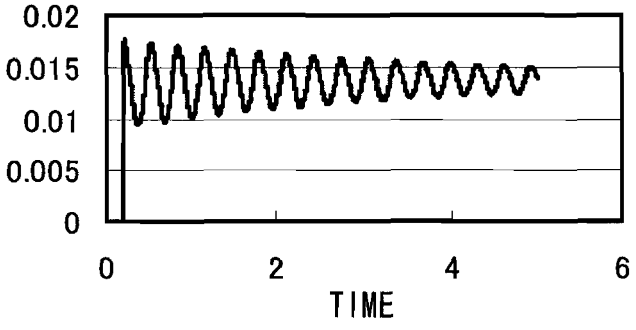
Figure 22:
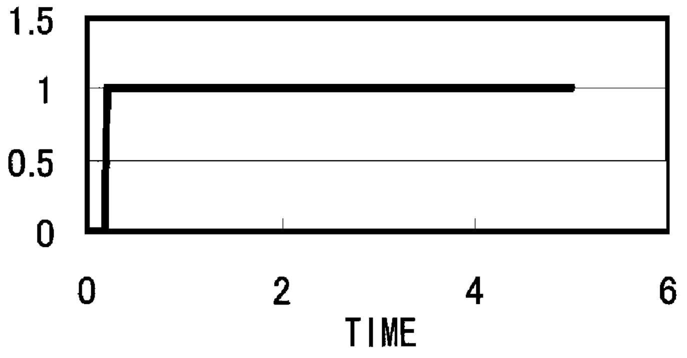
FIG. 22 shows a step input and its response in the feedback loop shown in FIG. 20.
Figure 22:
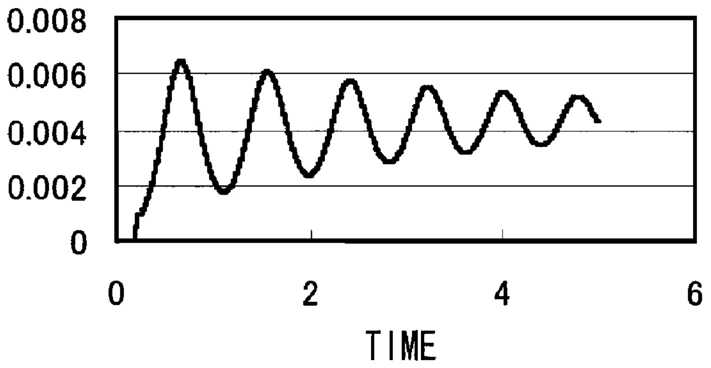
Figure 23:
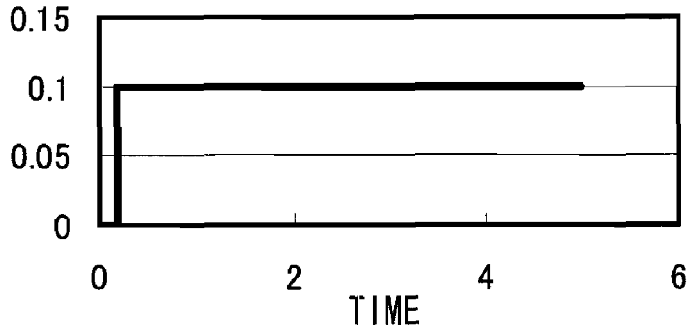
FIG. 23 shows a step input and its response in the feedback loop shown in FIG. 20.
Figure 23:
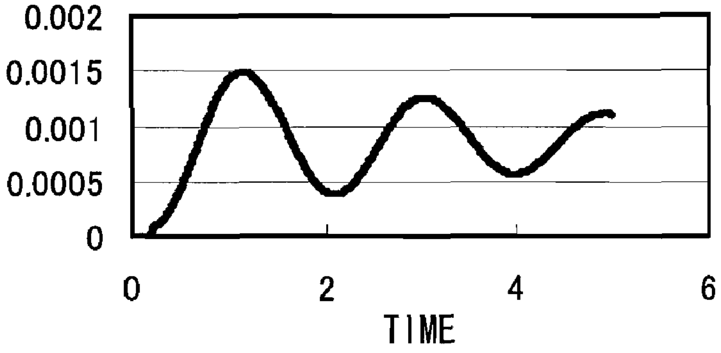

Step response results in the feedback loop shown in FIG. 20 are shown in FIGS. 21 to 23. FIG. 21 shows a step input and its response when a stiffness Kx which is the non-linear component of the above stiffness K(x) is 20000, the phase margin is −0.849°, and the gain crossover frequency fgc is 5.4 Hz in the configuration shown in FIG. 20. FIG. 22 shows a step input and its response when the stiffness Kx is 5000, the phase margin is −1.7°, and the gain crossover frequency fgc is 2.7 Hz in the configuration shown in FIG. 20. FIG. 23 shows a step input and its response when the stiffness Kx is 1200, the phase margin is −3.46°, and the gain crossover frequency fgc is 1.3 Hz in the configuration shown in FIG. 20.

Referring to each step response shown in FIGS. 21 to 23, it is seen that all the step responses converge as time advances. Thus, even in the case where the phase crossover frequency fpc does not exist and the phase is minus in the gain crossover frequency fgc, oscillation does not occur, and the stability is high.

It is noted that in FIGS. 21 to 23, since analysis is performed with the feedback loop of the loudspeaker device 2 shown in FIG. 10, the gain crossover frequency fgc also rises as the stiffness Kx rises. As the gain crossover frequency fgc rises, the frequency of the convergence waveform of the step response rises.

Fourth Embodiment

Figure 24:
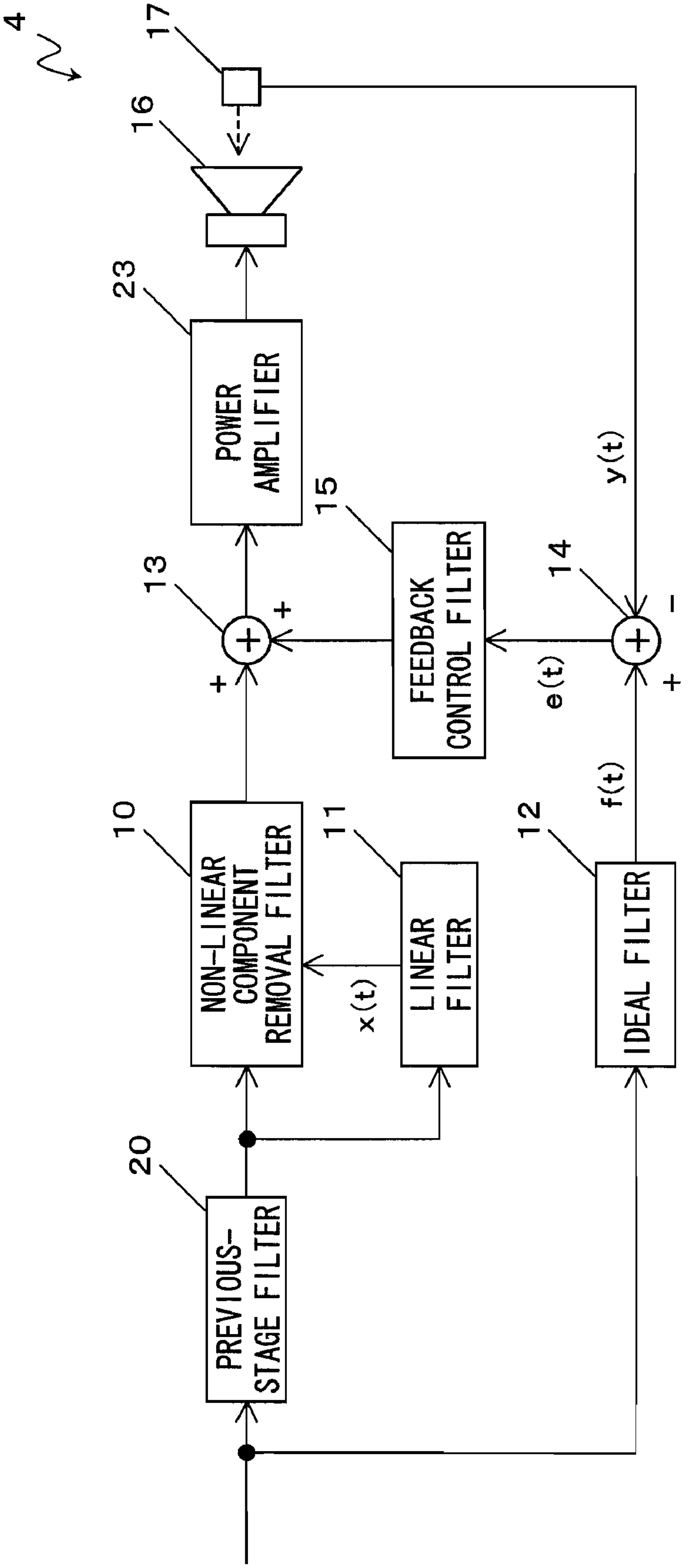
FIG. 24 is a block diagram showing an exemplary configuration of a loudspeaker device 4 according to a fourth embodiment.

With reference to FIG. 24, a loudspeaker device 4 according to a fourth embodiment of the present invention will be described. FIG. 24 is a block diagram showing an exemplary configuration of the loudspeaker device 4 according to the fourth embodiment. The loudspeaker device 4 according to the present embodiment differs from the loudspeaker devices 1 to 3 according to the above first to third embodiments in further having a power amplifier 23. In FIG. 24, as an example, the loudspeaker device 4 comprises a non-linear component removal filter 10, a linear filter 11, an ideal filter 12, an adder 13, an adder 14, a feedback control filter 15, a loudspeaker 16, a sensor 17, a previous-stage filter 20, and the power amplifier 23.

For putting the loudspeaker devices according to the above first to third embodiments into practical use, a power amplifier for driving the loudspeaker 16 is needed. Here, in the case where among components which constitute the loudspeaker devices according to the above first to third embodiments, there is a component, such as the non-linear component removal filter 10, and the like, which cannot handle a high voltage in internal processing, the power amplifier 23 needs to be provided immediately before the loudspeaker 16 as shown in FIG. 24.

In FIG. 24, the output signal of the adder 13 which removes non-linear distortion is amplified by the power amplifier 23. For example, it is assumed that the gain of the power amplifier 23 is ten times and the input voltage of the loudspeaker device 4 shown in FIG. 24 is 1V. In this case, the output voltage from the power amplifier 23 becomes 10V. Here, in the case where the input to the non-linear component removal filter 10 is 1V, the non-linear component removal filter 10 produces a signal which removes non-linear distortion when the input to the loudspeaker 16 is 1V. Thus, when the output signal of the adder 13 is amplified to 10V, there arises a problem that it does not match the magnitude of the non-linear distortion of the loudspeaker 16.

Thus, the scale of each parameter constituting the filter coefficient which each component has needs to be adjusted so that the output signal amplified by the power amplifier 23 corresponds to the level of the non-linear distortion of the loudspeaker 16. Hereinafter, processing of adjusting the scale of each parameter is referred to as scaling processing.

The following will describe the operating principle of the loudspeaker device 4 shown in FIG. 24. It is noted that in the following description, it is assumed that the gain of the power amplifier 23 is ten times. The operation equation of the loudspeaker 16 is expressed as the equation (8) as described above.

$$(A0+Ax)*E(t)/Ze=(K0+Kx)*x(t)+[r+(A0+Ax)^2/Ze]*dx(t)/dt+m*d^2x(t)/dt^2 \quad (8)$$

Here, since the gain of the power amplifier 23 is ten times, each parameter is multiplied by 1/10. Thus, the equation (8) is scaled down to a 1/10 model to be equation (19).

$$\tfrac{1}{10}*(A0+Ax)*E(t)/(\tfrac{1}{10}*Ze)=\tfrac{1}{10}*(K0+Kx)*x(t)+[\tfrac{1}{10}*r+\{\tfrac{1}{10}(A0+Ax)\}^2/(\tfrac{1}{10}*Ze)]*dx(t)/dt+\tfrac{1}{10}*m*d^2x(t)/dt^2 \quad (19)$$

The above equation (19) is arranged to be equation (20).

$$(A0+Ax)*E(t)/0.1/Ze=(K0+Kx)*x(t)+[r+(A0+Ax)^2/Ze]*dx(t)/dt+m*d^2x(t)/dt^2 \quad (20)$$

This represents an operation like when a voltage of 10V is applied, when the input voltage E is 1V.

Next, from the result of the above equation (13), the non-linear component removal filter 10 produces a voltage Eff(t) so as to cancel the non-linear component as expressed by equation (21).

$$Eff(t)=[E(t)-Ze/(A0+Ax)*(Ax/Ze*E(t)-(2*A0*Ax+Ax^2)/Ze*dx(t)/dt-Kx*x(t))] \quad (21)$$

Here, considering similarly to the equation (19), each parameter of the equation (21) may be multiplied by 1/10 to obtain an output for removing non-linear distortion, which corresponds to the operation of the loudspeaker like when a voltage of 10V is applied, when the input voltage E is 1V. Thus, the equation (21) becomes equation (22).

$$Eff(t)=[E(t)-(\tfrac{1}{10}*Ze)/\{\tfrac{1}{10}*(A0+Ax)\}*\{(\tfrac{1}{10}*Ax)/(\tfrac{1}{10}*Ze)*E(t)-(2*\tfrac{1}{10}*A0*\tfrac{1}{10}*Ax+(\tfrac{1}{10}*Ax)^2)\}/(\tfrac{1}{10}*Ze)*dx(t)/dt-\tfrac{1}{10}*Kx*x(t))] \quad (22)$$

Further, the above equation (22) is arranged to be equation (23).

$$Eff(t)=[E(t)/0.1-Ze/(A0+Ax)*(Ax/Ze*E(t)/0.1-(2*A0*Ax+Ax^2)/Ze*dx(t)/dt-Kx*x(t))] \quad (23)$$

The operation of the loudspeaker 16 to which the voltage Eff(t) indicated by the equation (23) is inputted becomes equation (24) from the above equation (13).

$$(A0+Ax)/Ze*[E(t)/0.1-Ze/(A0+Ax)*(Ax/Ze*E(t)/0.1-(2*A0*Ax+Ax^2)/Ze*dx(t)/dt-Kx*x(t))]=(K0+Kx)*x(t)+[r+(A0+Ax)^2/Ze]*dx(t)/dt+m*d^2x(t)/dt^2 \quad (24)$$

In other words, when the input voltage E(t) is 1V, since the E(t)/0.1 is 10V, an operation and processing is the same as those when a voltage which is amplified to 10V by the gain of the amplifier, and so-called scaling processing is possible.

Therefore, where the gain of the power amplifier 23 is denoted by G, in the case of performing the scaling processing, each parameter may be multiplied by 1/G as expressed by equation (25).

$$Eff(t)=[E(t)-(1/G*Ze)/\{1/G*(A0+Ax)\}*\{(1/G*Ax)/(1/G*Ze)*E(t)-(2*1/G*A0*1/G*Ax+(1/G*Ax)^2)\}/(1/G*Ze)*dx(t)/dt-1/G*Kx*x(t))] \quad (25)$$

It is noted that the previous-stage filter 20, the ideal filter 12, and the linear filter 11 may perform the same scaling processing as that of the non-linear removal filter 10 as described above.

As described above, by performing the scaling processing, the magnitude of the output voltage of the non-linear distortion removal filter 10 can be caused to correspond to the magnitude of the input voltage to the loudspeaker 16 which is outputted from the power amplifier 23 in the case where the power amplifier 23 is located immediately before the loudspeaker 16. In addition, the feedforward processing section such as the non-linear distortion removal filter 10, and the like can respond when a voltage at which the feedforward processing section can perform internal processing is limited.

Figure 25:
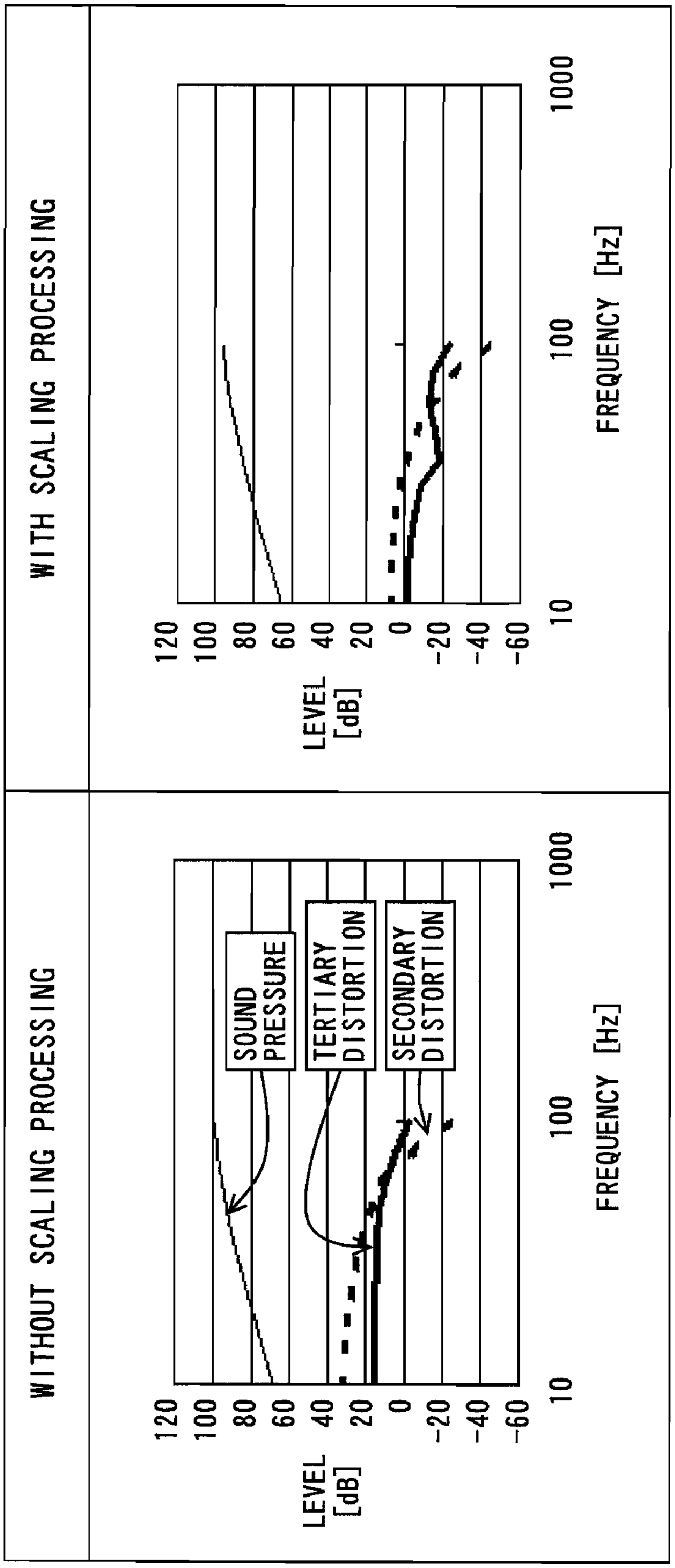
FIG. 25 shows a comparison of frequency characteristics with and without scaling processing.

Further, FIG. 25 shows a comparison of frequency characteristics with and without the scaling processing. As shown in FIG. 25, it is seen that the levels of secondary and tertiary distortions with the scaling processing are smaller and the effect of distortion removal is higher. This is because a feedback gain increases by adding the power amplifier 23 to the feedback processing section and the same effect as descried with the gain characteristic G2 in FIG. 12 is obtained.

Figure 26:
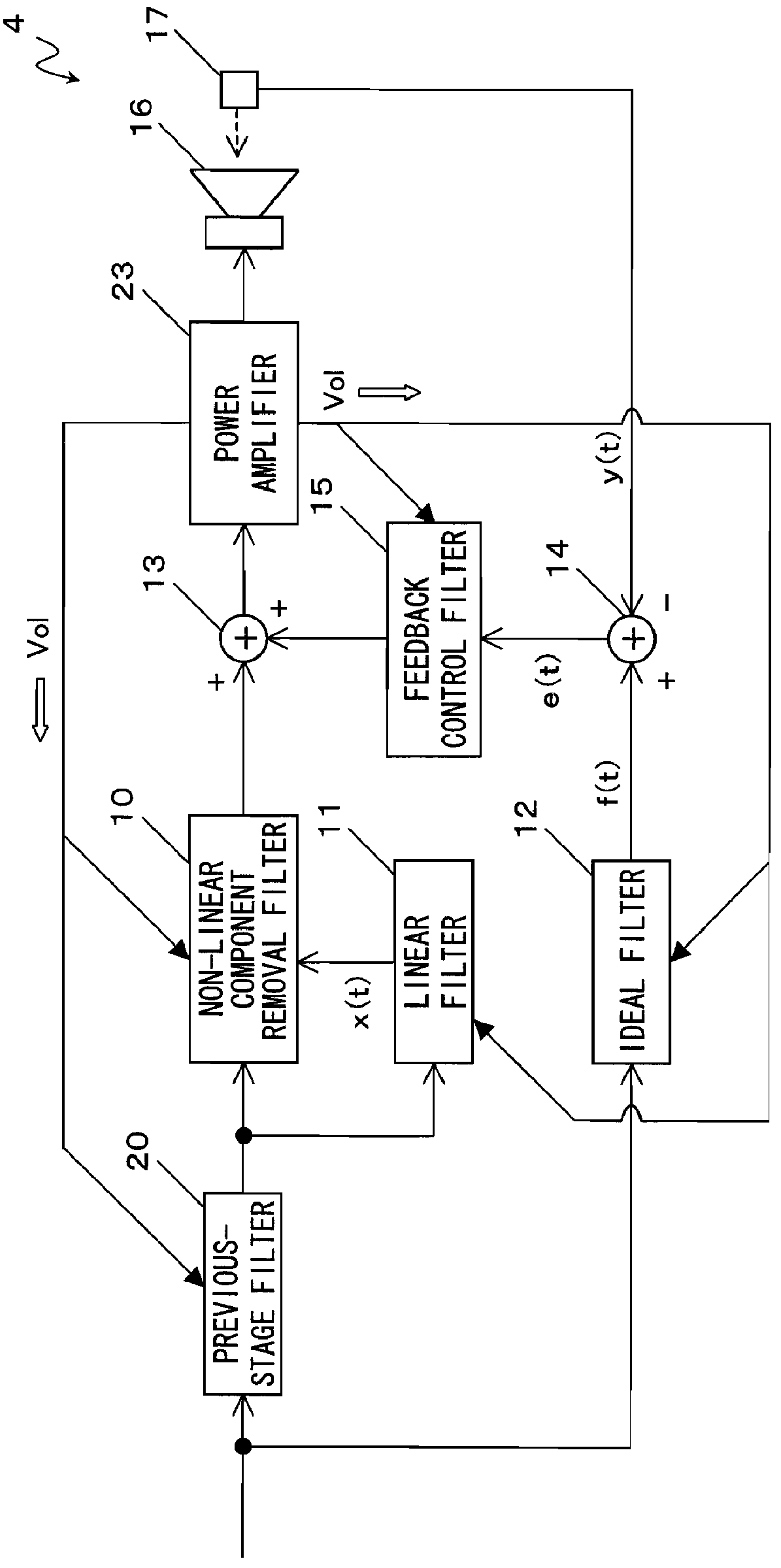
FIG. 26 illustrates an exemplary configuration in which a volume of a power amplifier 23 is linked to each component.

It is noted that as shown in FIG. 26, the volume of the power amplifier 23 maybe linked to the non-linear component removal filter 10, the linear filter 11, the ideal filter 12, the feedback control filter 15, and the previous-stage filter 20, and volume information Vol may be reflected to each component. Thus, a coefficient, 1/G, in the above equation (25) can be changed adaptively. It is note that the volume information Vol indicates information of the gain value.

Figure 27:
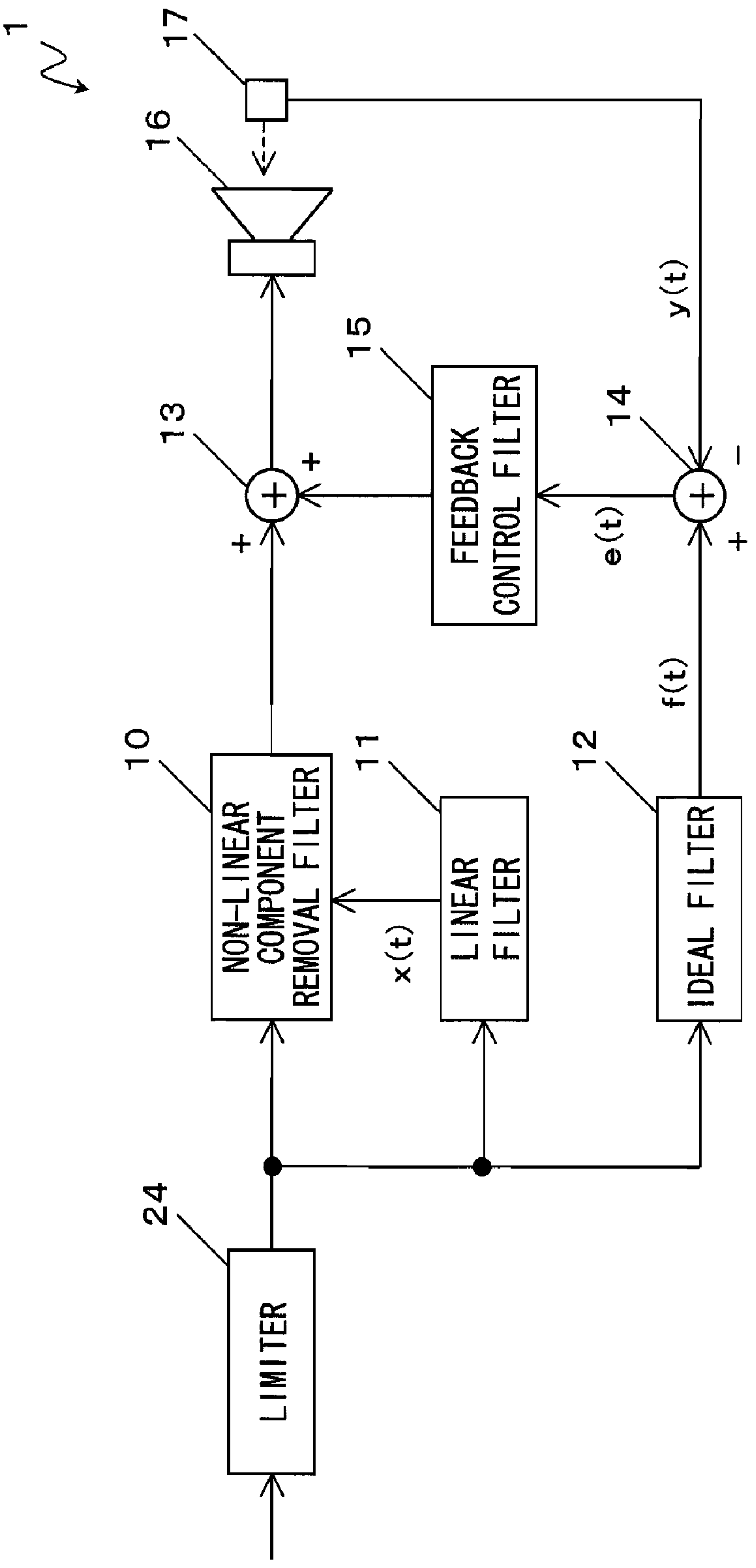
FIG. 27 is a block diagram showing an exemplary configuration in which a limiter 24 is provided in the loudspeaker device 1 shown in FIG. 1.
Figure 28:
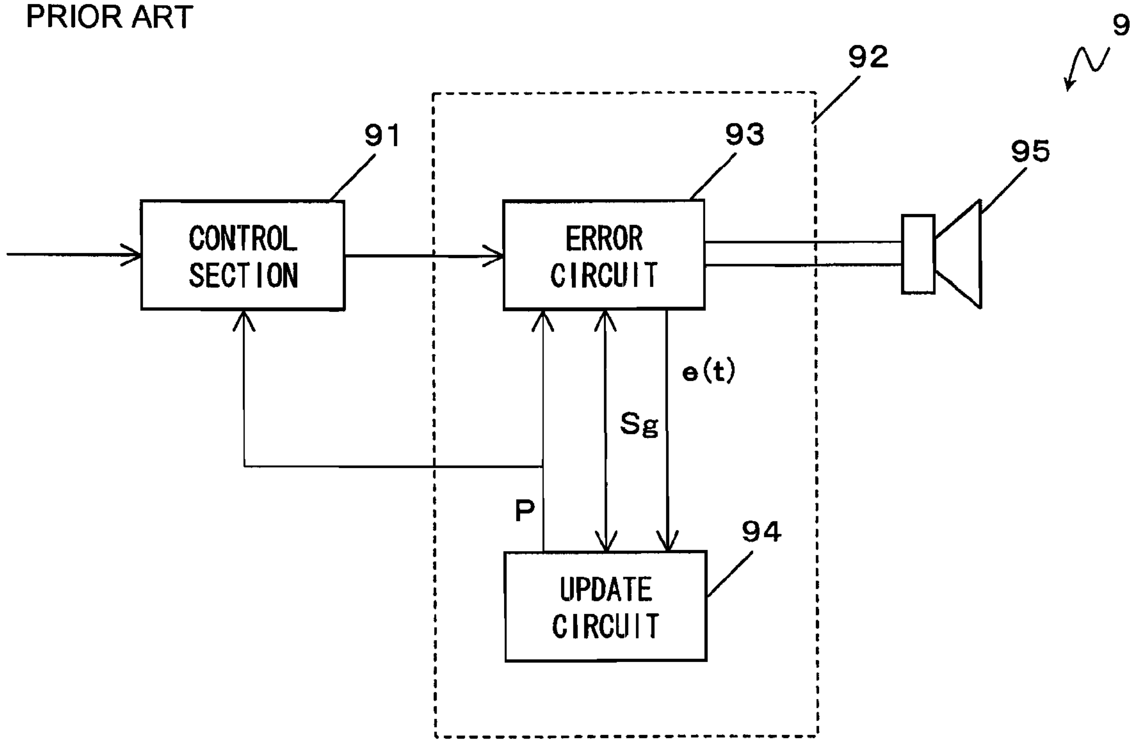
FIG. 28 PRIOR ART
FIG. 28 is a block diagram showing a conventional loudspeaker device 9.

It is noted that in the loudspeaker devices 1 to 4 described in the first to fourth embodiments, a limiter 24 may be further provided. Thus, the loudspeaker 16 can be prevented from being damaged due to a large input. FIG. 27 is a block diagram showing an exemplary configuration in which the limiter 24 is provided in the loudspeaker device 1 shown in FIG. 1. In FIG. 27, the limiter 24 limits the level of the input signal to be equal to or lower than the level at which the loudspeaker 16 is damaged. Therefore, even when a large input signal is inputted, a signal the level of which is equal to or higher than the level set at the limiter 24 is not inputted to the loudspeaker 16, thereby preventing the loudspeaker 16 from being damaged. It is noted that the position of the limiter 24 is not limited to the position shown in FIG. 27, and may be, for example, between the output of the non-linear component removal filter 10 and the input of the adder 13 or between the output of the adder 13 and the input of the loudspeaker 16. In other words, the limiter 24 may be located at any position at which the limiter 24 can limit the input of the loudspeaker 16.

In the loudspeaker devices 1 to 4 described in the first to fourth embodiments, the non-linear component removal filter 10, the linear filter 11, the ideal filter 12, the adder 13, the adder 14, the feedback control filter 15, the previous-stage filter 20, the compensating filter 21, the high-pass filter 22, the power amplifier 23, and the limiter 24 may be formed as an integrated circuit. At this time, the integrated circuit includes an output terminal for outputting an electric signal to the loudspeaker 16, a first input terminal for inputting an electric signal, and a second input terminal for inputting a detection signal of the sensor 17. In the first to fourth embodiments as described above, electric circuits for performing each function described above are integrated into a small package, and, for example, a sound signal processing circuit DSP (Digital Signal Processor), and the like is formed, thereby enabling realization of the present invention. Also, the non-linear component removal filter 10, the linear filter 11, and the ideal filter 12 can be formed as an integrated circuit, and each function can be achieved by a DSP. It is effective in the case where the processing time of the DSP adversely affects the feedback processing and the effect is diluted.

INDUSTRIAL APPLICABILITY

The loudspeaker device according to the present invention can be used for application to a loudspeaker device which perform signal processing so as to follow a change of the parameter in the actual loudspeaker and is capable of performing more stable distortion removal processing, a thin loudspeaker, and the like.

The invention claimed is:

1. A loudspeaker device comprising:

a loudspeaker which includes a diaphragm, a support system component including an edge and damper for supporting the diaphragm so as to allow the diaphragm to vibrate, and a voice coil which produces a driving force which causes the diaphragm to vibrate;

a feedforward processing section for performing feedforward processing on an electric signal to be inputted to the loudspeaker based on a filter coefficient which includes at least a fixed parameter in which a vibration displacement characteristic indicating a stiffness of the support system component with respect to a vibration displacement of the diaphragm is modeled and a fixed parameter in which a vibration displacement characteristic indicating a force coefficient with respect to the vibration displacement of the diaphragm which is applied to the voice coil is modeled, the filter coefficient being set so as to cancel a non-linear component of each parameter; and a feedback processing section for detecting vibration of the diaphragm, and performing feedback processing on an electric signal concerning the vibration with respect to the electric signal to be inputted to the loudspeaker, wherein the feedback processing section performs feedback processing on the electric signal concerning the vibration so that a change of the vibration displacement characteristic indicating the stiffness of the support system component is cancelled and so that a frequency characteristic concerning the vibration of the diaphragm becomes a desired frequency characteristic.

2. The loudspeaker device according to claim 1, wherein the feedforward processing section is provided in a position before the loudspeaker and provided in a feedback loop which is formed by the feedback processing section.

3. The loudspeaker device according to claim 1, wherein the change of the vibration displacement characteristic indicating the stiffness of the support system component occurs by a secular change of a material forming the support system component or a creep phenomenon of the material forming the support system component.

4. The loudspeaker device according to claim 1, wherein the material forming the support system is cloth or resin.

5. The loudspeaker device according to claim 1, wherein the feedback processing section includes:

an ideal filter for receiving the electric signal to be inputted to the loudspeaker, and converting the frequency characteristic of the received electric signal into the desired frequency characteristic;

a sensor for detecting the vibration of the diaphragm;

a first adder for taking a difference between the electric signal which is converted by the ideal filter and indicates the desired frequency characteristic and the electric signal concerning the vibration which is detected by the sensor, and outputting an electric signal of the difference as an error signal; and a second adder for adding the electric signal which is processed by the feedforward processing section and the error signal, and outputting a resultant electric signal to the loudspeaker.

6. The loudspeaker device according to claim 5, wherein the feedforward processing section includes:

a removal filter for receiving the electric signal to be inputted to the loudspeaker, and processing the received electric signal based on the filter coefficient; and a linear filter for receiving the electric signal to be inputted to the loudspeaker, and producing an electric signal which indicates a vibration displacement of the diaphragm when the diaphragm linearly vibrates, and the removal filter refers to the electric signal which is produced by the linear filter and indicates the vibration displacement.

7. The loudspeaker device according to claim 6, further comprising a power amplifier which is provided between the second adder and the loudspeaker for amplifying a gain of the electric signal to be inputted to the loudspeaker, wherein the filter coefficient of the removal filter, a filter coefficient of the ideal filter, and a filter coefficient of the linear filter are filter coefficients which are multiplied by an inverse number of a value of the gain which is amplified by the power amplifier.

8. The loudspeaker device according to claim 5, wherein the electric signal detected by the sensor is an electric signal which indicates the vibration displacement of the diaphragm, and the feedforward processing section refers to the electric signal which is detected by the sensor and indicates the vibration displacement.

9. The loudspeaker device according to claim 5, further comprising a previous-stage filter which is provided in a stage prior to the feedforward processing section for receiving the electric signal to be inputted to the loudspeaker, and processing the received electric signal based on a filter coefficient which is obtained by subtracting a characteristic of the loudspeaker concerning the vibration from the desired frequency characteristic.

10. The loudspeaker device according to claim 5, further comprising a limiter for limiting a level of an electric signal so as not to input to the loudspeaker an electric signal a level of which is equal to or higher than a predetermined level.

11. The loudspeaker device according to claim 5, further comprising a power amplifier which is provided between the second adder and the loudspeaker for amplifying a gain of the electric signal to be inputted to the loudspeaker, wherein the filter coefficient of the feedforward processing section, and a filter coefficient of the ideal filter are filter coefficients which are multiplied by an inverse number of a value of the gain which is amplified by the power amplifier.

12. The loudspeaker device according to claim 1, wherein the feedback processing section includes:

an ideal filter for receiving the electric signal to be inputted to the loudspeaker, and converting the frequency characteristic of the received electric signal into the desired frequency characteristic;

a sensor for detecting the vibration of the diaphragm;

a first adder for taking a difference between the electric signal which is converted by the ideal filter and indicates the desired frequency characteristic and the electric signal concerning the vibration which is detected by the sensor, and outputting an electric signal of the difference as an error signal; and a second adder for adding the electric signal to be inputted to the loudspeaker and the error signal, and outputting a resultant electric signal to the feedforward processing section, and the feedforward processing section performs feedforward processing on the electric signal outputted from the second adder, and outputs a resultant electric signal to the loudspeaker.

13. The loudspeaker device according to claim 12, further comprising a low-pass filter which is provided between the second adder and the feedforward processing section, and has a filter coefficient for a gain of the electric signal to be inputted to the loudspeaker to indicate a characteristic which is inclined at a gradient of −6 dB/oct or less in a frequency band which is equal to or lower than a first frequency, wherein the first frequency is a frequency which is equal to or higher than a gain crossover frequency indicated by an open-loop transfer characteristic of a feedback loop which is formed by the feedback processing section.

14. The loudspeaker device according to claim 12, further comprising a high-pass filter which is provided in a stage prior to the feedforward processing section, and has a filter coefficient for a gain of the electric signal to be inputted to the loudspeaker to indicate a characteristic which is inclined at a gradient of 6 dB/oct or more in a frequency band which is equal to or lower than a second frequency, wherein the second frequency is a frequency which is equal to or higher than a gain crossover frequency indicated by an open-loop transfer characteristic of a feedback loop which is formed by the feedback processing section.

15. The loudspeaker device according to claim 12, further comprising:

a low-pass filter which is provided between the second adder and the feedforward processing section, and has a filter coefficient for a gain of the electric signal to be inputted to the loudspeaker to indicate a characteristic which is inclined at a gradient of −6 dB/oct or less in a frequency band which is equal to or lower than a first frequency; and a high-pass filter which is provided in a stage prior to the feedforward processing section, and has a filter coefficient for the gain of the electric signal to be inputted to the loudspeaker to indicate a characteristic which is inclined at a gradient of 6 dB/oct or more in a frequency band which is equal to or lower than a second frequency, wherein the first and second frequencies are frequencies which are equal to or higher than a gain crossover frequency indicated by an open-loop transfer characteristic of a feedback loop which is formed by the feedback processing section.

16. The loudspeaker device according to claim 12, wherein the feedforward processing section includes:

a removal filter for receiving the electric signal outputted from the second adder, and processing the received electric signal based on the filter coefficient; and a linear filter for receiving the electric signal outputted from the second adder, and producing an electric signal which indicates a vibration displacement of the diaphragm when the diaphragm linearly vibrates, and the removal filter refers to the electric signal which is produced by the linear filter and indicates the vibration displacement.

17. The loudspeaker device according to claim 16, further comprising a power amplifier which is provided between the feedforward processing section and the loudspeaker for amplifying a gain of the electric signal to be inputted to the loudspeaker, wherein the filter coefficient of the removal filter, a filter coefficient of the ideal filter, and a filter coefficient of the linear filter are filter coefficients which are multiplied by an inverse number of a value of the gain which is amplified by the power amplifier.

18. The loudspeaker device according to claim 12, wherein the electric signal detected by the sensor is an electric signal which indicates the vibration displacement of the diaphragm, and the feedforward processing section refers to the electric signal which is detected by the sensor and indicates the vibration displacement.

19. The loudspeaker device according to claim 12, further comprising a previous-stage filter which is provided in a position before the second adder for receiving the electric signal to be inputted to the loudspeaker, and processing the received electric signal based on a filter coefficient which is obtained by subtracting a characteristic of the loudspeaker concerning the vibration from the desired frequency characteristic.

20. The loudspeaker device according to claim 12, further comprising a limiter for limiting a level of an electric signal so as not to input to the loudspeaker an electric signal a level of which is equal to or higher than a predetermined level.

21. The loudspeaker device according to claim 12, further comprising a power amplifier which is provided between the feedforward processing section and the loudspeaker for amplifying a gain of the electric signal to be inputted to the loudspeaker, wherein the filter coefficient of the feedforward processing section, and a filter coefficient of the ideal filter are filter coefficients which are multiplied by an inverse number of a value of the gain which is amplified by the power amplifier.

22. An integrated circuit for processing an electric signal to be inputted to a loudspeaker which includes a diaphragm, a support system component including an edge and a damper for supporting the diaphragm so as to allow the diaphragm to vibrate, and a voice coil which produces a driving force which causes the diaphragm to vibrate, the integrated circuit comprising:

a feedforward processing section for performing feedforward processing on an electric signal to be inputted to the loudspeaker based on a filter coefficient which includes at least a fixed parameter in which a vibration displacement characteristic indicating a stiffness of the support system component with respect to a vibration displacement of the diaphragm is modeled and a fixed parameter in which a vibration displacement characteristic indicating a force coefficient with respect to the vibration displacement of the diaphragm which is applied to the voice coil is modeled, the filter coefficient being set so as to cancel a non-linear component of each parameter; and a feedback processing section for detecting vibration of the diaphragm, and performing feedback processing on an electric signal concerning the vibration with respect to the electric signal to be inputted to the loudspeaker, wherein the feedback processing section performs feedback processing on the electric signal concerning the vibration so that a change of the vibration displacement characteristic indicating the stiffness of the support system component is cancelled and so that a frequency characteristic according to the vibration of the diaphragm becomes a desired frequency characteristic.

* * * * *